(12) United States Patent
Lutz et al.

(10) Patent No.: US 9,665,347 B2
(45) Date of Patent: *May 30, 2017

(54) APPARATUS AND METHOD FOR PERFORMING CONVERSION OPERATION

(71) Applicant: ARM Limited, Cambridge (GB)

(72) Inventors: David Raymond Lutz, Austin, TX (US); Neil Burgess, Austin, TX (US); Christopher Neal Hinds, Austin, TX (US)

(73) Assignee: ARM Limited, Cambridge (GB)

( * ) Notice: Subject to any disclaimer, the term of this patent is extended or adjusted under 35 U.S.C. 154(b) by 209 days.

This patent is subject to a terminal disclaimer.

(21) Appl. No.: 14/582,812

(22) Filed: Dec. 24, 2014

(65) Prior Publication Data

US 2016/0126974 A1 May 5, 2016

Related U.S. Application Data

(60) Provisional application No. 62/074,149, filed on Nov. 3, 2014.

(51) Int. Cl.
*G06F 5/00* (2006.01)
*G06F 7/483* (2006.01)
(Continued)

(52) U.S. Cl.
CPC .............. *G06F 7/483* (2013.01); *G06F 5/012* (2013.01); *G06F 7/38* (2013.01); *G06F 7/48* (2013.01); *G06F 7/4991* (2013.01); *G06F 7/49915* (2013.01); *G06F 7/49921* (2013.01); *G06F 7/49942* (2013.01); *G06F 7/507* (2013.01); *G06F 9/3001* (2013.01); *G06F 9/30014* (2013.01); *G06F 9/3016* (2013.01); *G06F 9/30018* (2013.01); *G06F 9/30025* (2013.01); *G06F 9/30036* (2013.01); *G06F 9/30112* (2013.01); *G06F 9/30185* (2013.01);
(Continued)

(58) Field of Classification Search
None
See application file for complete search history.

(56) References Cited

U.S. PATENT DOCUMENTS

| 4,240,144 A | 12/1980 | Kindell et al. |
| 4,622,650 A | 11/1986 | Kulisch |

(Continued)

FOREIGN PATENT DOCUMENTS

| CA | 2 418 916 | 7/1998 |
| EP | 2 711 835 | 3/2014 |

(Continued)

OTHER PUBLICATIONS

International Search Report and Written Opinion of the International Searching Authority dated Dec. 9, 2015 issued in PCT/GB2015/052733, 15 pages.

(Continued)

*Primary Examiner* — David H Malzahn
(74) *Attorney, Agent, or Firm* — Nixon & Vanderhye P.C.

(57) ABSTRACT

An apparatus comprises processing circuitry to perform a conversion operation to convert a vector comprising a plurality of data elements representing respective bit significance portions of a binary value to a scalar value comprising an alternative representation of said binary value.

20 Claims, 15 Drawing Sheets

(51) Int. Cl.

| | | |
|---|---|---|
| *G06F 7/499* | (2006.01) | |
| *G06F 9/30* | (2006.01) | |
| *G06F 17/16* | (2006.01) | |
| *H03M 7/12* | (2006.01) | |
| *H03M 7/24* | (2006.01) | |
| *G06F 11/34* | (2006.01) | |
| *G06F 11/36* | (2006.01) | |
| *G06F 5/01* | (2006.01) | |
| *G06F 7/38* | (2006.01) | |
| *G06F 7/48* | (2006.01) | |
| *G06F 7/507* | (2006.01) | |
| *G06F 9/38* | (2006.01) | |
| *G06F 7/506* | (2006.01) | |

(52) U.S. Cl.
CPC ........ *G06F 9/30192* (2013.01); *G06F 9/3885* (2013.01); *G06F 11/3476* (2013.01); *G06F 11/3636* (2013.01); *G06F 11/3648* (2013.01); *G06F 17/16* (2013.01); *H03M 7/12* (2013.01); *H03M 7/24* (2013.01); *G06F 7/506* (2013.01); *G06F 11/3404* (2013.01); *G06F 11/348* (2013.01); *G06F 11/3644* (2013.01); *G06F 2201/865* (2013.01); *G06F 2207/483* (2013.01)

(56) References Cited

U.S. PATENT DOCUMENTS

| | | | |
|---|---|---|---|
| 4,866,653 | A | 9/1989 | Kulisch et al. |
| 5,602,769 | A | 2/1997 | Yu |
| 5,619,198 | A | 4/1997 | Blackham |
| 5,968,165 | A | 10/1999 | Hansen |
| 6,108,772 | A | 8/2000 | Sharangpani |
| 6,247,116 | B1 | 6/2001 | Abdallah et al. |
| 6,460,177 | B1 | 10/2002 | Lee |
| 6,564,238 | B1 | 5/2003 | Kim |
| 6,629,119 | B1 | 9/2003 | Chen et al. |
| 6,633,895 | B1 | 10/2003 | Bass et al. |
| 6,671,796 | B1 | 12/2003 | Sudharsanan et al. |
| 7,647,368 | B2 | 1/2010 | Ford |
| 8,024,394 | B2 | 9/2011 | Prokopenko |
| 8,468,191 | B2 | 6/2013 | Mantor |
| 8,595,279 | B2 | 11/2013 | Dockser |
| 8,984,042 | B2 | 3/2015 | Gschwind |
| 2002/0026569 | A1 | 2/2002 | Liao et al. |
| 2002/0154769 | A1 | 10/2002 | Petersen et al. |
| 2004/0128331 | A1 | 7/2004 | Hinds et al. |
| 2004/0240355 | A1 | 12/2004 | Honda |
| 2005/0055389 | A1 | 3/2005 | Ramanujam |
| 2007/0220076 | A1 | 9/2007 | Hinds |
| 2009/0112955 | A1 | 4/2009 | Kershaw et al. |
| 2009/0113186 | A1 | 4/2009 | Kato et al. |
| 2010/0138841 | A1 | 6/2010 | Dice |
| 2011/0078225 | A1 | 3/2011 | Johnson et al. |
| 2011/0173421 | A1 | 7/2011 | Chen et al. |
| 2012/0011181 | A1 | 1/2012 | Samy |
| 2012/0089655 | A1 | 4/2012 | Erinjippurath et al. |
| 2013/0038589 | A1 | 2/2013 | Tseng |
| 2013/0311532 | A1 | 11/2013 | Olsen |
| 2014/0149481 | A1 | 5/2014 | Carlough et al. |
| 2016/0124710 | A1* | 5/2016 | Lutz ........ G06F 7/483 708/495 |
| 2016/0124711 | A1* | 5/2016 | Lutz ........ G06F 7/483 708/190 |
| 2016/0124712 | A1* | 5/2016 | Larri ........ G06F 7/483 708/495 |
| 2016/0124714 | A1* | 5/2016 | Lutz ........ G06F 7/483 708/498 |
| 2016/0124746 | A1* | 5/2016 | Lutz ........ G06F 7/483 712/222 |
| 2016/0126974 | A1* | 5/2016 | Lutz ........ G06F 7/483 708/204 |
| 2016/0126975 | A1* | 5/2016 | Lutz ........ G06F 7/483 708/204 |

FOREIGN PATENT DOCUMENTS

| | | |
|---|---|---|
| GB | 2 186 105 | 8/1987 |
| GB | 2 396 929 | 7/2004 |
| WO | 2010/112970 | 10/2010 |

OTHER PUBLICATIONS

International Search Report and Written Opinion of the International Searching Authority dated Nov. 30, 2015 issued in PCT/GB2015/052731, 15 pages.
International Search Report and Written Opinion of the International Searching Authority dated Feb. 22, 2016 issued in PCT/GB2015/052732, 14 pages.
"ARM Virtualization Extensions—Introduction (Part 1)" dated Oct. 7, 2014 according to the ISR, and retrieved, according to the ISR, Feb. 1, 2016 from http://web.archive.org/web/20141007033630/http://www.futurechips.org/understanding-chips/arm-virtualization-extensions-introduction-part-1.html 3 pages.
P. Krishnamurthy et al, "Evaluating Dusty Caches on General Workloads" Proc. of $5^{th}$ Workshop on Duplicating, Deconstructing, and Debunking, Jun. 30, 2006, 9 pages.
International Search Report and Written Opinion of the International Searching Authority dated Apr. 12, 2016 issued in PCT/GB2015/052700, 13 pages.
International Search Report and Written Opinion of the International Searching Authority dated Mar. 18, 2016 issued in PCT/GB2015/052730, 14 pages.
U.S. Appl. No. 14/582,968, filed Dec. 24, 2014, Lutz et al.
U.S. Appl. No. 14/582,974, filed Dec. 24, 2014, Lutz et al.
U.S. Appl. No. 14/582,978, filed Dec. 24, 2014, Lutz et al.
U.S. Appl. No. 14/582,836, filed Dec. 24, 2014, Lutz et al.
U.S. Appl. No. 14/582,875, filed Dec. 24, 2014, Lutz et al.
U.S. Appl. No. 14/606,510, filed Jan. 27, 2015, Larri et al.
W.L. Miranker, "Systolic Super Summation with Reduced Hardware" Mathematical Sciences Department, IBM T.J. Watson Research Center, 1992, pp. 1-11.
J. McCalpin, "Ordered Summation", John McCalpin's blog, Dec. 19, 2014, 4 pages.
J. Monteiro et al, "A1CSA: An Energy-Efficient Fast Adder Architecture for Cell-Based VLSI Design" 2011 $18^{th}$ IEEE International Conference on Electronics, Circuits and Systems, Dec. 11-14, 2011, pp. 442-445.
R. Srinivasasamanoj et al, "High Speed VLSI Implementation of 256-bit Parallel Prefix Adders" Int. J. Wireless Communications and Networking Technologies, vol. 1, No. 1, Aug.-Sep. 2012, pp. 4-9.
Office Action mailed Nov. 4, 2016 in co-pending U.S. Appl. No. 14/582,974, 12 pages.
Office Action mailed Nov. 4, 2016 in co-pending U.S. Appl. No. 14/582,978, 11 pages.
Office Action mailed Oct. 25, 2016 in co-pending U.S. Appl. No. 14/582,836, 13 pages.
Office Action mailed Oct. 14, 2016 in co-pending U.S. Appl. No. 14/582,875, 14 pages.
Office Action mailed Jan. 13, 2017 in co-pending U.S. Appl. No. 14/606,510, 30 pages.
Office Action mailed Jan. 30, 2017 in co-pending U.S. Appl. No. 14/582,968, 18 pages.
Final Office Action mailed Jan. 31, 2017 in co-pending U.S. Appl. No. 14/582,875, 6 pages.
Final Office Action mailed Feb. 28, 2017 in co-pending U.S. Appl. No. 14/582,836 8 pages.

* cited by examiner

| index[127:0] | 127 | 126 | 125 | ... | 65 | 64 | 63 | 62 | ... | 51 | 50 | 49 | ... | 2 | 1 | 0 |
|---|---|---|---|---|---|---|---|---|---|---|---|---|---|---|---|---|
| | 1 | 1 | 1 | 1 | 1 | 1 | 0 | 0 | 0 | 0 | 0 | 0 | 0 | 0 | 0 | 0 |
| weight | sign | 76 | 75 | ... | 15 | 14 | 13 | 12 | ... | 1 | 0 | -1 | ... | -48 | -49 | -50 |

| $LZC_j$ | $V_i[j]$ | $V_i[j-1]$ |
|---|---|---|
| 0 | 63:11 | |
| 1 | 62:10 | |
| ... | ... | ... |
| 11 | 52:10 | |
| 12 | 51:0 | 63 |
| 13 | 50:0 | 63:62 |
| 14 | 49:0 | 63:61 |
| ... | ... | ... |
| 62 | 1:0 | 63:13 |
| 63 | 0 | 63:12 |

FIG. 5

| | 1 | 2 | 3 | 4 | 5 |
|---|---|---|---|---|---|
| ADDO_HPF_FP ($V_i$, $V_a$, F1) | C | A | | | |
| ADDO_HPF_FP ($V_i$, $V_a$, F2) | | C | A | | |
| ADDO_HPF_FP ($V_i$, $V_a$, F3) | | | C | A | |
| ADDO_HPF_FP ($V_i$, $V_a$, F4) | | | | C | A |

FIG. 6

| | 1 | 2 | 3 | 4 | 5 |
|---|---|---|---|---|---|
| ADD_HPF_FP ($V_{iL}$, $V_{aL}$, F1) | $C_L$ | $A_L$ | | | |
| ADDCO_HPF_FP ($V_{iH}$, $V_{aH}$, F1) | | $C_H$ | $A_H$ | | |
| ADD_HPF_FP ($V_{iL}$, $V_{aL}$, F2) | | | $C_L$ | $A_L$ | |
| ADDCO_HPF_FP ($V_{iH}$, $V_{aH}$, F2) | | | | $C_H$ | $A_H$ |

FIG. 7

APPARATUS AND METHOD FOR PERFORMING CONVERSION OPERATION

The present application claims priority to US provisional application 62/074,149, filed on Nov. 3, 2014, the entire contents of which is herein incorporated by reference.

BACKGROUND

The present technique relates to the field of data processing.

It is known to provide data processing systems supporting integer arithmetic and floating point arithmetic.

SUMMARY

One aspect provides an apparatus comprising:

processing circuitry to perform a conversion operation to convert a vector comprising a plurality of data elements representing respective bit significance portions of a binary value to a scalar value comprising an alternative representation of said binary value.

Another aspect provides a data processing method comprising:

performing, using processing circuitry, a conversion operation to convert a vector comprising a plurality of data elements representing respective bit significance portions of a binary value to a scalar value comprising an alternative representation of said binary value.

Another aspect provides an apparatus comprising:

processing circuitry to perform a conversion operation to convert a first data value in a high-precision anchored format to a second data value providing an alternative representation of the first data value.

The above, and other objects, features and advantages will be apparent from the following detailed description of illustrative embodiments which is to be read in connection with the accompanying drawings.

BRIEF DESCRIPTION OF THE DRAWINGS

FIG. 5 an example of generating a significand when converting an HPA number to a floating-point number;

FIG. 6 illustrates an example of adding several floating-point values using HPA arithmetic, where the HPA number fits in the hardware size;

FIG. 7 illustrates an example of adding several floating-point values using HPA arithmetic, where the HPA number is wider than the hardware size;

DESCRIPTION OF EXAMPLES

Figure 1:
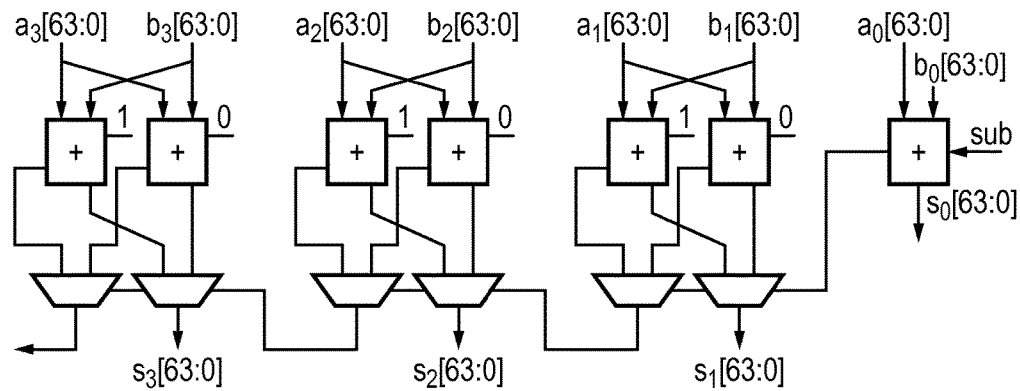
FIG. 1 schematically illustrates a carry-select adder.

There is disclosed a new datatype and new instructions that allow fast and correct accumulation of floating-point (FP) numbers in a programmer-selectable range. For the modest ranges that will accomodate most problems, the accumulation is faster than FP addition, and is associative. Associative addition allows the problems to be parallelized while still giving reproducible and correct results, enabling speedups by, for example, a factor of 100 or more as compared to existing hardware. We believe these benefits will be irresistible in the high-performance computing (HPC) space, and compelling for many non-HPC applications.

A known issue with floating-point (FP) arithmetic is that it is non-associative, a fact that makes sums problematic:

programmers need to worry about wildly different results, even when adding 3 numbers programmers use wider formats than they need, in the hope of avoiding the wildly different results programmers can't easily parallelize code, because sums aren't reproducible unless computed in the exact same order.

For example, in single precision, $$2^{20}+(-2^{44}+2^{44})=2^{20}$$

but $$(2^{20}+-2^{44})+2^{44}=0$$

Depending upon the order the operations are performed, the result is one million or zero. This is an extreme example because the exponents differ by 24, but we can get different answers if the exponents differ by 1, or even if all of the exponents are the same and we are adding more than 3 things. The C programming language addresses the reproducibility problem by requiring sums to be evaluated left-to-right, in order, but this does nothing for correctness, and makes parallelization impossible.

The problems are especially acute for high-performance computing (HPC), where programs may need to add millions of things. Programmers would like to parallelize these problems, but then the lack of reproducibility makes debugging even harder than it usually is. Different configurations of machines will produce different answers even if the reprogramming for those machines is done perfectly.

Floating-Point Numbers

Floating-point (FP) is a useful way of approximating real numbers using a small number of bits. The IEEE 754-2008 FP standard proposes multiple different formats for FP numbers, some which are binary 64 (also known as double precision, or DP), binary 32 (also known as single precision, or SP), and binary 16 (also known as half precision, or HP). The numbers 64, 32, and 16 refer to the number of bits required for each format.

Representation

FP numbers are quite similar to the "scientific notation" taught in science classes, where instead of negative two million we'd write $-2.0 \times 10^6$. The parts of this number are the sign (in this case negative), the significand (2.0), the base of the exponent (10), and the exponent (6). All of these parts have analogs in FP numbers, although there are differences, the most important of which is that the constituent parts are stored as binary numbers, and the base of the exponent is always 2.

More precisely, FP numbers consist of a sign bit, some number of biased exponent bits, and some number of fraction bits. In particular, the DP, SP and HP formats consist of the following bits:

| format | sign | exponent | fraction | exponent bias |
|---|---|---|---|---|
| DP [63:0] | 63 | 62:52 (11 bits) | 51:0 (52 bits) | 1023 |
| SP [31:0] | 31 | 30:23 (8 bits) | 22:0 (23 bits) | 127 |
| HP [15:0] | 15 | 14:10 (5 bits) | 9:0 (10 bits) | 15 |

The sign is 1 for negative numbers and 0 for positive numbers. Every number, including zero, has a sign.

The exponent is biased, which means that the true exponent differs from the one stored in the number. For example, biased SP exponents are 8-bits long and range from 0 to 255. Exponents 0 and 255 are special cases, but all other exponents have bias 127, meaning that the true exponent is 127 less than the biased exponent. The smallest biased exponent is 1, which corresponds to a true exponent of −126. The maximum biased exponent is 254, which corresponds to a true exponent of 127. HP and DP exponents work the same way, with the biases indicated in the table above.

SP exponent 255 (or DP exponent 2047, or HP exponent 31) is reserved for infinities and special symbols called NaNs (not a number). Infinities (which can be positive or negative) have a zero fraction. Any number with exponent 255 and a nonzero fraction is a NaN. Infinity provides a saturation value, so it actually means something like "this computation resulted in a number that is bigger than what we can represent in this format." NaNs are returned for operations that are not mathematically defined on the real numbers, for example division by zero or taking the square root of a negative number.

Exponent zero, in any of the formats, is reserved for subnormal numbers and zeros. A normal number represents the value:

$$-1^{sign} \times 1.\text{fraction} \times 2^e$$

where e is the true exponent computed from the biased exponent. The term 1.fraction is called the significand, and the 1 is not stored as part of the FP number, but is instead inferred from the exponent. All exponents except zero and the maximum exponent indicate a significand of the form 1.fraction. The exponent zero indicates a significand of the form 0.fraction, and a true exponent that is equal to 1-bias for the given format. Such a number is called subnormal (historically these numbers were referred to as denormal, but modern usage prefers the term subnormal).

Numbers with both exponent and fraction equal to zero are zeros.

The following table has some example numbers in HP format. The entries are in binary, with '_' characters added to increase readability. Notice that the subnormal entry (4th line of the table, with zero exponent) produces a different significand than the normal entry in the preceding line.

| sign | 5-bit exponent | 10-bit fraction | 11-bit significand | value |
|---|---|---|---|---|
| 0 | 01111 | 00_0000_0000 | 100_0000_0000 | $1.0 \times 2^0$ |
| 1 | 01110 | 10_0000_0000 | 110_0000_0000 | $-1.1 \times 2^{-1}$ |
| 0 | 00001 | 10_0000_0000 | 110_0000_0000 | $1.1 \times 2^{-14}$ |
| 0 | 00000 | 10_0000_0000 | 010_0000_0000 | $0.1 \times 2^{-14}$ |
| 1 | 11111 | 00_0000_0000 | | −infinity |
| 0 | 11111 | 00_1111_0011 | | NaN |

A large part of the complexity of FP implementation is due to subnormals, therefore they are often handled by microcode or software. Some processors handle subnormals in hardware, speeding up these operations by a factor of 10 to 100 compared to a software or microcode implementation.

Integers, Fixed-Point, Floating-Point

The FP way of handling signs is called sign-magnitude, and it is different from the usual way integers are stored in the computer (two's complement). In sign-magnitude representation, the positive and negative versions of the same number differ only in the sign bit. A 4-bit sign-magnitude integer, consisting of a sign bit and 3 significand bits, would represent plus and minus one as:

+1=0001

−1=1001

In two's complement representation, an n-bit integer i is represented by the low order n bits of the binary n+1−bit value $2^n+i$, so a 4-bit two's complement integer would represent plus and minus one as:

+1=0001

−1=1111

The two's complement format is practically universal for signed integers because it simplifies computer arithmetic.

A fixed-point number looks exactly like an integer, but actually represents a value that has a certain number of fractional bits. Sensor data is often in fixed-point format, and there is a great deal of fixed-point software that was written before the widespread adoption of FP. Fixed-point numbers are quite tedious to work with because a programmer has to keep track of the "binary point", i.e. the separator between the integer and fractional parts of the number, and also has to constantly shift the number to keep the bits in the correct place. FP numbers don't have this difficulty, so it is desirable to be able to convert between fixed-point numbers and FP numbers. Being able to do conversions also means that we can still use fixed-point software and data, but we are not limited to fixed-point when writing new software.

Rounding FP Numbers

Most FP operations are required by the IEEE-754 standard to be computed as if the operation were done with unbounded range and precision, and then rounded to fit into an FP number. If the computation exactly matches an FP number, then that value is always returned, but usually the computation results in a value that lies between two consecutive floating-point numbers. Rounding is the process of picking which of the two consecutive numbers should be returned.

There are a number of ways of rounding, called rounding modes; six of these are:

| mode | | definition |
|---|---|---|
| RNE | round-to nearest, ties to even | pick the closest value, or if both values are equally close then pick the even value |
| RNA | round to nearest, ties to away | pick the closest value, or if both values are equally close then pick the value farthest away from zero |
| RZ | round to zero | pick the value closest to zero |
| RP | round to plus infinity | pick the value closest to plus infinity |
| RM | round to minus infinity | pick the value closest to minus infinity |
| RX | round to odd | pick the odd value |

The definition doesn't tell us how to round in any practical way. One common implementation is to do the operation, look at the truncated value (i.e. the value that fits into the FP format) as well as all of the remaining bits, and then adjust the truncated value if certain conditions hold. These computations are all based on:

L—(least) the least significant bit of the truncated value
G—(guard) the next most significant bit (i.e. the first bit not included in the truncation)
S—(sticky) the logical OR of all remaining bits that are not part of the truncation Given these three values and the truncated value, we can always compute the correctly rounded value according to the following table:

| mode | change to the truncated value |
|---|---|
| RNE | increment if (L&G)|(G&S) |
| RNA | increment if G |
| RZ | none |
| RP | increment if positive & (G|S) |
| RM | increment if negative & (G|S) |
| RX | set L if G|S |

For example, consider multiplying two 4-bit significands, and then rounding to a 4-bit significand.

sig1=1011 (decimal 11)

sig2=0111 (decimal 7)

multiplying yields sig1 × sig2 = 1001_101 (decimal 77)
                 L  Gss

The least significant bit of the truncated 4-bit result is labeled L, the next bit G, and S is the logical OR of the remaining bits labeled s (i.e. S=0|1=1). To round, we adjust our 4-bit result (1001) according to the rounding mode and the computation in the table above. So for instance in RNA rounding, G is set so we return 1001+1=1010. For RX rounding G|S is true so we set L to 1 (it's already 1, so in this case nothing changes) and return 1001.

Rounding Integer and Fixed-Point Numbers

If we convert an FP number to integer or fixed-point we also round. The concept is basically the same as FP rounding. An FP number that happens to be an integer always rounds to that integer. All other FP numbers lie between two consecutive integers, and rounding dictates which integer is returned. Unfortunately the rounding logic for integers is somewhat harder because of the differences between two's complement and sign-magnitude form. Incrementing a sign-magnitude number always increases the magnitude, so the incremented number is farther away from zero. The same thing happens for positive two's complement numbers, but negative two's complement numbers become closer to zero when incremented. This means that the rounding logic has to change based on whether the integer is positive or negative. It also means we have to be careful in picking the base value (the value which will be incremented or not). For positive integers, that value is just the truncated FP significand, so 1.37 will have a base value of 1, and a result of either 1 or 2. For negative integers, we again truncate the significand and take the one's complement of the result (one's complement is the original number with all bits inverted), −1.37 is truncated to 1 and then inverted, giving a base value of −2. Everything then works out since we want our result to be either −2 or (when incremented) −1.

To further complicate things, our method of conversion requires some computation to find L, G, and S for negative integers. Correct rounding would require us to complete the two's complement process (invert and add 1) and then compute L, G, and S, but adding that 1 is slow compared to just inverting. Ideally we would like to compute the actual L, G, and S from the original shifted input (i.e., from the input before we've done anything about signs. So the floating-point 1.37 or −1.37 would both be right shifted to the integer 1).

Let L0, G0, and S0 be the least significant bit (lsb), guard and sticky before inverting, and let Li, Gi, and Si be lsb, guard and sticky after inverting, and finally let L, G, and S be the lsb, guard and sticky after inverting and adding 1.

If S0 is zero, then the bits contributing to Si are all ones, and hence S (obtained by adding 1 to those Si bits) is also zero. If S0 is nonzero, then Si is not all ones, and hence S is nonzero. So in all cases S0=S.

If G0 is zero, then Gi is 1, and G is also one except for the case when there is a carry-in from the S bits, which only happens when S0 is zero. If G0 is 1, then Gi is zero, and again G is also one except for the case where there is a carry-in from the S bits, which only happens when S0 is zero. So G=G0^S0.

By very similar logic, L=L0^(G0|S0).

Now that we have L, G, and S for both negative and positive integers, we can come up with our rounding rules:

| mode | change to a positive value | change to a negative value |
|---|---|---|
| RNE | increment if (L&G)|(G&S) | increment if (L&G)|(G&S) |
| RNA | increment if G | increment if (G&S) |
| RZ | none | increment if (G|S) |

| mode | change to a positive value | change to a negative value |
|------|---------------------------|---------------------------|
| RP   | increment if (G\|S)       | increment if (G\|S)       |
| RM   | none                      | none                      |
| RX   | set L if G\|S             | set L if G\|S             |

Fixed-point numbers round exactly the same way as integers. The rules for unsigned conversions (to integer or fixed-point) are the same as the rules for positive conversions.

Injection Rounding

A faster way to do rounding is to inject a rounding constant as part of the significand addition that is part of almost every FP operation. To see how this works, consider adding numbers in dollars and cents and then rounding to dollars. If we add $$\begin{array}{r}\$1.27\\+\$2.35\\\hline\$3.62\end{array}$$

We see that the sum $3.62 is closer to $4 than to $3, so either of the round-to-nearest modes should return $4. If we represented the numbers in binary, we could achieve the same result using the L, G, S method from the last section. But suppose we just add fifty cents and then truncate the result?

$$\begin{array}{r}1.27\\+\,2.35\\+\,0.50\text{ (rounding injection)}\\\hline 4.12\end{array}$$

If we just returned the dollar amount ($4) from our sum ($4.12), then we have correctly rounded using RNA rounding mode. If we added $0.99 instead of $0.50, then we would correctly round using RP rounding. RNE is slightly more complicated: we add $0.50, truncate, and then look at the remaining cents. If the cents remaining are nonzero, then the truncated result is correct. If there are zero cents remaining, then we were exactly in between two dollar amounts before the injection, so we pick the even dollar amount. For binary FP this amounts to setting the least significant bit of the dollar amount to zero.

Adding three numbers is only slightly slower than adding two numbers, so we get the rounded result much more quickly by using injection rounding than if we added two significands, examined L, G, and S, and then incremented our result according to the rounding mode.

Implementing Injection Rounding

For FP, the rounding injection is one of three different values, values which depend on the rounding mode and (sometimes) the sign of the result.

Both RNA and RNE require us to inject a 1 at the G position (this is like adding $0.50 in our dollars and cents example).

RP and RM rounding depends on the sign as well as the mode. RP rounds positive results up (increases the magnitude of the significand towards positive infinity), but truncates negative results (picking the significand that is closer to positive infinity). Similarly RM rounds negative results up (increasing the magnitude of the significand toward negative infinity), but truncates positive results (picking the significand that is closer to negative infinity). Thus we split RM and RP into two cases: round up (RU) when the sign matches the rounding direction, and truncation (RZ) when the sign differs from the rounding injection. For RU cases we inject a 1 at the G-bit location and at every location that contributes logically to S (this is like adding $0.99 in our dollars and cents example).

For RZ and RX modes, and for RP and RM modes that reduce to RZ mode, we inject zeros.

For most of the rounding modes, adding the rounding injection and then truncating gives the correctly rounded result. The two exceptions are RNE and RX, which require us to examine G and S after the addition. For RNE, we set L to 0 if G and S are both zero. For RX we set L to 1 if G or S are nonzero.

FP Number Are Not Real Numbers

It's tempting to think of FP numbers as being just like real numbers, but they are fundamentally different, even for the most basic properties:

1. They are not associative. For example, in SP we can add 3 numbers and return 1 million or zero, perhaps not what people think of as a rounding error:

$(2^{45}+-2^{45})+2^{20}=2^{20}$ $2^{45}(-2^{45}+2^{20})=0$

2. They don't obey the distributive laws. Again in SP:

$3{,}000{,}001*(4.00001+5.00001)=0x4bcdfe83$ $(3{,}000{,}001*4.00001)+(3{,}000{,}001*5.00001)=0x4bcdfe82$ and things get even worse in the presence of overflow:

$2^{50}*(2^{78}-2^{77})=2^{127}$ $(2^{50}*2^{78})-(2^{50}*2^{77})=\text{infinity}$ 3. For some implementations, they aren't even commutative unless we are in default NaN mode (a mode that converts all NaNs to a single NaN), because in general nanA+nanB !=nanB+nanA. Numeric adds and multiplies are commutative.

4. Because of IEEE NaN rules, there are no multiplicative or additive identities. One and zero work as identities for numeric values.

One useful way to think of FP numbers is to consider them to be very long fixed-point numbers in which at most a few (53 for DP) consecutive bits can be nonzero. For example, non-infinite DP numbers can have the first bit of the significand in any of 2046 places, and that first bit is followed by 52 other significant bits, and there is a sign bit, so any finite DP number can be represented as a 2046+52+1=2099-bit fixed point number. Examined this way it becomes very obvious that adding two FP numbers does not, in general, result in another FP number: the result of the addition has to be rounded so that it becomes an FP number.

High-Precision Anchored Numbers

A high-precision anchored (HPA) number is a pair (i,a) consisting of a long two's complement integer i (commonly 128 bits or more), and a smaller anchor integer a that represents the weights of the bits of i (typically by specifying the exponent value of the smallest bit of i). The anchor integer a may be considered to provide a programmable significance parameter/value. The anchor integer a may form part of metadata for the HPA number that can include addition information, such as exception information: infinite, sign, NaN. The pair is somewhat analogous to an FP number's significand and exponent values, but differs in that the long integer i is not normalized and is usually much larger than an FP significand, and the anchor value a may be fixed for all of the inputs to a sum. Adding FP numbers causes the exponent to change, but adding HPA numbers does not change the anchor.

As a trivial example, consider an HPA representation consisting of a 10-bit i and a anchor value of −4. Some values in this format are given in Table 1:

TABLE 1 example HPA numbers (i, −4)

| i (binary)    | value(decimal) |
|---------------|----------------|
| 00000_00001   | 0.0625         |
| 00000_01000   | 0.5            |
| 00000_11000   | 1.5            |
| 00001_00000   | 2.0            |
| 00100_11000   | 9.5            |
| 11111_01000   | −1.5           |

When we add two of these numbers, say 0.5 and 1.5, the anchor doesn't change, and the sum is conveniently given by just adding the i parts. Since HPA sums are just two's complement addition, HPA sums are associative.

One way of making a realizable HPA accumulator employs the following:
1. a way to limit the range of numbers required so that the HPA accumulators don't have to be enormous.
2. a way to add large two's complement numbers quickly.
3. a fast unit to convert from FP to HPA, and
4. a unit to convert from the HPA to FP.

We will address each of these requirements in the following sections.

Limiting the Range

FP numbers have a large range. Double precision (DP) numbers can be smaller than $2^{-1000}$ and larger than $2^{1000}$, but most accumulations do not span this entire range. Indeed, it's hard to imagine the kind of problem that would meaningfully accumulate values over all of that range. Sub-atomic problems might accumulate very small values, and astronomic computations might accumulate very large values, but it is not generally useful to add the width of a proton to the distance between galaxies. Even for high-performance computing, most accumulations happen over a limited range.

Many programmers use FP for convenience, not for FP's range. Audio codecs may use FP, and audio data has a limited range both in frequency and volume. It's easier to program in FP, and this is attractive to programmers.

If a programmer determines that all of the data for a particular sum has magnitude less than $2^{60}$, and that values with magnitude below $2^{-50}$ won't affect the sum in any meaningful way, then, if the data is added using the HPA format (i,−50) with 128-bit i, then the accumulation is associative and the numbers can be added in any order.

Adding Large Numbers

We propose considering a vector of 64-bit integers to be one longer integer. For example, 256-bit integers would consist of four 64-bit integers.

Given two such vectors, we can make modest changes to a 64-bit SIMD adder (like ARM Limited's NEON SIMD engine) to compute the 256-bit sum a+b. Addition is accomplished by adding the low-order 64 bits, then the next 64 bits together with the carry out of the low-order addition, and so on. In practice this may be implementable in a single cycle for quite large SIMD units—a 1024-bit adder is probably achievable.

One way for modest sizes (say up to 256 bits) is to construct a carry-select adder, as in FIG. 1. Each lane i computes $a_i+b_i$ and $a_i+b_i+1$, and the carry out of lane i−1 is used to choose between the two sums. We think this could be easily computed in a single cycle for our current CPUs.

Figure 2:
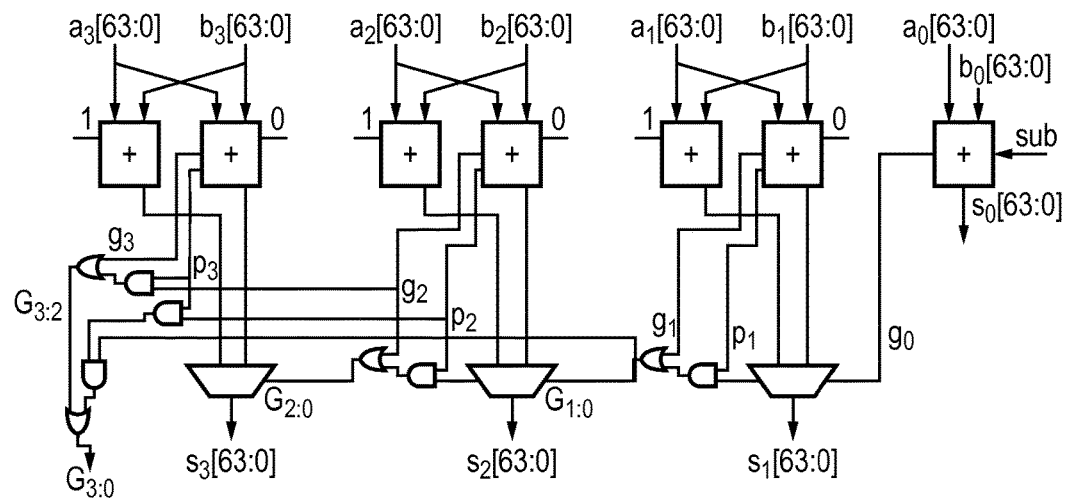
FIG. 2 schematically illustrates a carry-lookahead adder.

For wider SIMD units (say up to 1024 bits), a carry-lookahead adder like the one in FIG. 2 can keep single-cycle performance. As before, each lane i computes $a_i+b_i$ and $a_i+b_i+1$, but the lane also computes whether its sum is all ones ($p_i$), i.e., whether the sum in lane i would propogate an input carry to lane i+1.

For SIMD widths that are more likely to be implemented in the near term, say 128 or 256 bits, the processor will need to keep track of vector carry-out and vector carry-in. A 1024-bit add could be accomplished in 4 cycles with a 256-bit implementation. Subtraction would be done in the usual way, with each lane i computing $a_i-b_i$ as $a_i+\overline{b_i}$, with a carry-in to the low order lane on the low order vector.

We propose 4 new instructions to accomplish long addition and subtraction:

1. LONGADD Vd, Vm, Vn

Vd=Vm+Vn, treating each SIMD vector as a single long integer. The instruction also creates a carry out C, where C=1 if there is a carry out from the high order lane of the sum, and C=0 otherwise.

2. LONGADDC Vd, Vm, Vn

Vd=Vm+Vn+C, treating each SIMD vector as a single long integer. The previously generated carry out C is added to the sum, and a new carry out is generated.

3. LONGSUB Vd, Vm, Vn

Vd=Vm−Vn=Vm+∼Vn+1, treating each SIMD vector as a single long integer. The instruction also creates a carry out C, where C=1 if there is a carry out from the high order lane of the sum, and C=0 otherwise.

4. LONGSUBC Vd, Vm, Vn

Vd=Vm−Vn+C=Vm+∼Vn+1+C, treating each SIMD vector as a single long integer. The previously generated carry out C is added to the sum, and a new carry out is generated.

In practice, these instructions would be used as follows. Suppose we have a 256-bit SIMD implementation, and we want to add 1024-bit vectors x and y. In C, these vectors would be declared as long long x[15:0], y[15:0];

So as to not get bogged down in load/store semantics, lets assume that these vectors are already in the register file. Then 1024-bit addition and subtraction look like the following:

```
// V0 contains x[3:0], V1 contains x[7:4],
// V2 contains x[11:8], V3 contains x[15:12]
// V4 contains y[3:0], V5 contains y[7:4],
// V6 contains y[11:8], V7 contains y[15:12]
// long addition to put x[15:0] + y[15:0]
// in (V13, V12, V11, V10)
LONGADD V10, V0, V4;
LONGADDC V11, V1, V5;
LONGADDC V12, V3, V6;
LONGADDC V13, V4, V7;
// long subtraction to put x[15:0] - y[15:0]
// in (V23, V22, V21, V20)
LONGSUB V20, V0, V4;
LONGSUBC V21, V1, V5;
LONGSUBC V22, V3, V6;
LONGSUBC V23, V4, V7;
```

Given a 256-bit implementation, 1024-bit adds and subtracts could each take 4 cycles. Such a capability would be useful for things other than FP accumulation, including cryptographic applications.

Converting, Adding, Subtracting FP to HPA

An HPA number is a pair (i,a), where i is a long two's complement integer and a is an anchor value giving the weight of the least significant bit of the integer (and hence the weight of all of the bits of the integer). Our long integers are going to be processed on SIMD units, so let's be a bit more specific about i and a. Suppose we have a 256-bit SIMD unit. Then the low order 256 bits of i are broken into four 64-bit parts, Vi[3:0]. It will be convenient to also have the anchor in four parts, Va[3:0], where Va[0]=a and Va[i] =Va[i−1]+64 for i>0. We haven't really changed anything here, but we are just adopting a more convenient SIMD representation, with the low order 256 bits of the HPA number (i,a) being represented as (Vi,Va).

Figures 3, 4:
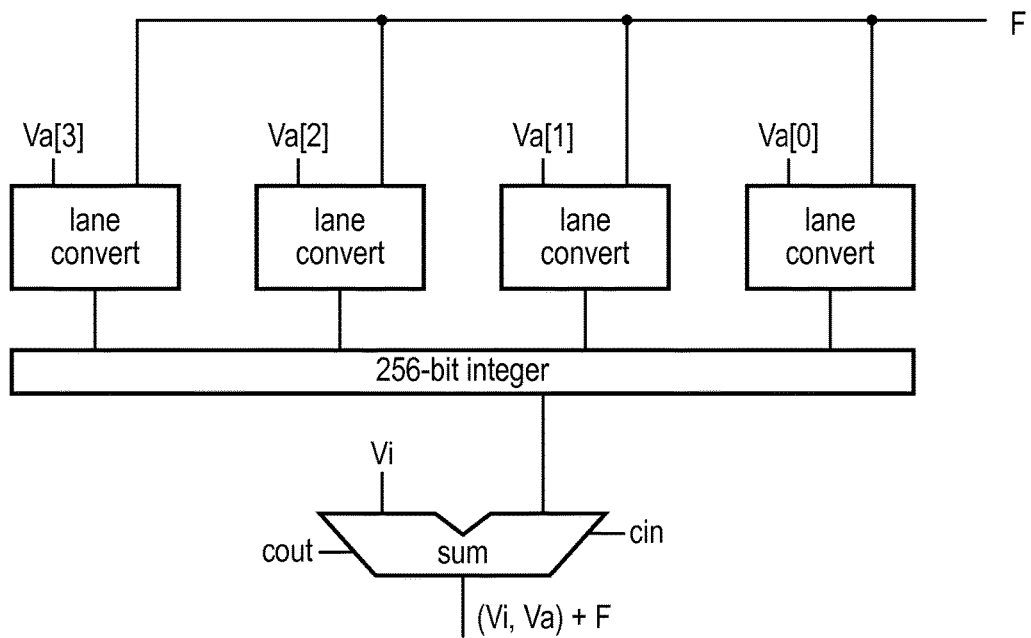
FIG. 3 illustrates a way of adding a floating-point number to an HPA number.
FIG. 4 illustrates an example HPA representation of a number.

FIG. 3 shows an efficient way of adding an FP number F to an HPA number (Vi,Va). Each lane of the SIMD unit has the lane-specific values of (Vi,Va), i.e., lane j has Vi[j] and Va[j]. Each lane also receives a copy of F. Each lane compares the exponent of F to its anchor value Va[j], and populates the lane with the appropriate bits of the significand of F. At most two of the lanes will contain significand bits. Each lane computes its 64-bit converted value independently, with the resulting 256-bit integer comprising the four 64-bit lane values. That 256-bit value is then added to Vi, possibly with a carry-in value cin, and the result is a new 256-bit value that reprents (Vi,Va)+F, together with a carry-out value cout. Note that it is meaningful to add these two 256-bit values as integers because both values have identical anchors.

Suppose we have a 128-bit SIMD unit, and we want to convert values using the anchor −50. This means that the lowest order bit of the 128-bit i corresponds to $2^{50}$, the next bit corresponds to $2^{-49}$, and so on (see FIG. 4). The high-order bit of Vi[0] corresponds to $2^{13}$, while the low order bit if Vi[1] corresponds to $2^{14}$. So an HPA number with value $2^{14}+2^{13}=24,576$ would have these two bits set. Bit 127 of i (the high order bit of Vi[1]) is a sign bit. An alternative embodiment may use an unsigned HPA format in which the value represented by the Vi part of the HPA number is unsigned. In this case, bit 127 of i would have value $2^{\wedge}(127+a)$, where a is the anchor value.

For FP conversions to HPA, each lane examines the true exponent of F and then compare that to the lane specific anchor. The same anchor (−50) is used for all examples, and the examples will be easier to follow by refering to FIG. 4.

Example 1 Suppose we want to convert the DP number F=1.0−ulp=3fef_ffff_ffff_ffff to HPA. The biased exponent is 3fe, the true exponent is −1, and the significand is 53 ones. The top lane sees that the exponent is too low (that lanes minimum weight is 14), so it fills its bits with zeros. The bottom lane sets bits [63:50] to zeros, and bits [49:0] to ones. There are 3 ones left in the significand, (corresponding to the value $2^{-51}+2^{-52}+2^{-53}$), but these will be omitted from the conversion because their weight is less than the anchor value −50. An alternate implementation might round the converted value, but for now let's assume truncation.

Example 2 F=$2^{20}$−ulp=412f_ffff_ffff_ffff. The true exponent is 19, so bits [127:70] are zeros, [69:17] are ones, and [16:0] are zeros. This number fits exactly, so rounding is irrelevant. Note that each lane still works independently on its own 64 bits.

Example 3 F=$-2^{20}$=c130_0000_0000_0000. The true exponent is 20, but now we have to deal with the sign. One method is to do the conversion as we did for positive numbers, but return the ones complement of the value we compute in each lane, then add one to the 128-bit value. In this case, bit 70 is the one set bit before the ones complement, so it is the one zero bit after the ones complement. Adding 1 to the 128 bit value gives us bits [127:70] set to ones, and bits [69:0] set to zeros.

Example 4 F=$2^{80}$=44f0_0000_0000_0000. The true exponent is 80, but our maximum weight is 76 so we set the overflow flag. I propose we return zeros in this case, or perhaps the maximum value in the high-order lane and zeros elsewhere (the low-order lanes don't know about the overflow, so we can't follow the examples of integer converts and return the maximum integer). This is a serious error, and so the result would be meaningless in any case.

Example 5 F=infinity or NaN. Return zeros, set OFC (infinity) or IOC (NaN).

Each lane does the conversions in the same way. One way is to position the significand just to the right of the 64 bits of the lane, and then left shift the significand by the value lshift=e−bias−Va[i]+1. Note that e'−bias is the the true exponent e, and if the lshift value is negative or zero then no shifting is done.

Conceptually, the input to the shifter is the 64+53=117 bit value consisting of 64 zeros followed by the significand (in practice the 64 zeros are not needed on input). The output of the shifter is the 64-bit value for the lane. Meaningful shift distances (i.e., shift distances that can put a significand bit into the lane) range between 1 and 64+52=116. Lshift values outside of this range don't require any shifting because they will always return zeros.

For example 1, e=−1, so the upper lane has lshift[1]=−1−14+1=−14 (negative, so no shift, and the lane contains all zeros) and the lower lane has lshift[0]=−1−(−50)+1=50, so the bottom 50 bits of the lane contain the high-order 50 bits of the significand.

For example 2, e=19, so lshift[1]=19−14+1=6 (top 6 bits of the significand are shifted in) and lshift[0]=19−(−50)+ 1=70. Note that the top 6 bits of the significand are shifted past the 64 bits of lane 0, and so are discarded for that lane.

For example 3, e=20, so lshift[1]=7 and lshift[0]=71. Because the input is negative, each lane returns the one's complement of its shifted value (and all ones for out-of-range shifts). The carry-in to the 128-bit adder is set to complete the two's complement operation for conversions or adds (HPA+FP). For subtracts (HPA−FP), the conversion should treat the FP number as positive and change the operation to an add.

We propose 3 new instructions for DP numbers:

1. ADDO_HPA_DP Vi, Va, F

Add with overflow: convert F to HPA using the anchor values in Va, then add to Vi. If bits of F are greater than the maximum weight bit in Vi, or if the sum causes an (integer) overflow, set the overflow flag. Note that, in this example, only the high-order lane of Vi can set the overflow flag, so implementations distinguish that lane from the lower-order lanes.

2. SUBO_HPA_DP Vi, Va, F

Subtract with overflow: convert F to HPA using the anchor values in Va, then subtract from Vi. If bits of F are greater than the maximum weight bit in Vi, or if the difference causes an (integer) overflow, set the overflow flag. Again, in this example, only the high-order lane of Vi can set the overflow flag, so implementations distinguish that lane from the lower-order lanes.

3. CVTO_HPA_DP Vi, Va, F

Convert with overflow: convert F to HPA using the anchor values in Va. If bits of F are greater than the maximum weight bit in Vi, set the overflow flag. Again, in this example, only the high-order lane of Vi can set the overflow flag, so implementations distinguish that lane from the lower-order lanes.

Note that, in at least some example embodiments, these operations can be done in two fully-pipelined cycles if the vector length fits in the SIMD implementation.

For vectors that are wider than the SIMD implementation, the converts and adds are done in pieces, from low order part to high order part. Just as in the long addition and subtract instructions described above, the higher order parts cope with a carry flag generated by the lower order parts, so there are also versions of the instructions that do that:

1. ADDCO_HPA_DP Vi, Va, F

Add with carry and overflow: convert F to HPA using the anchor values in Va, then add to Vi. If the carry flag is high, add 1 to the integer part of the HPA number. If bits of F are greater than the maximum weight bit in Vi, or if the sum causes an (integer) overflow, set the overflow flag.

2. SUBCO_HPA_DP Vi, Va, F

Subtract with carry and overflow: convert F to HPA using the anchor values in Va, then subtract from Vi. If the carry flag is high, add 1 to the integer part of the HPA number. If bits of F are greater than the maximum weight bit in Vi, or if the difference causes an (integer) overflow, set the overflow flag.

3. CVTCO_HPA_DP Vi, Va, F

Convert with carry and overflow: convert F to HPA using the anchor values in Va. If the carry flag is high, add 1 to the integer part of the HPA number. If bits of F are greater than the maximum weight bit in Vi, set the overflow flag.

There are also non-overflowing versions of the instructions, so that the low order parts of an operation do not set the overflow flag.

1. ADD_HPA_DP Vi, Va, F
2. SUB_HPA_DP Vi, Va, F
3. CVT_HPA_DP Vi, Va, F
4. ADDC_HPA_DP Vi, Va, F
5. SUBC_HPA_DP Vi, Va, F
6. CVTC_HPA_DP Vi, Va, F

There are analogous instructions for SP numbers.

The convert instructions are not strictly necessary, because they are equivalent to add instructions where the integer part of the HPA number is all zeros.

Suppose the HPA numbers are implemented as 128-bit vectors. The following examples show how these instructions could be used.

Example 6 the HPA numbers fit in a 128-bit value. Then adding a DP number D0 to an HPA number (V0, V10) is simply

ADDO_HPA_DP V0, V10, D0

Carries are not needed because there is no higher-order term, but overflow detection is important.

Example 7 HPA numbers are 256-bits wide, but hardware handles 128 bits at a time. The HPA numbers are split into a low-order part (V0, V10), and a high-order part (V1, V11). Adding a DP number D0 is now

ADD_HPA_DP V0, V10, D0
ADDCO_HPA_DP V1, V11, D0

Note that both instructions receive the same DP number D0. This is necessary because we do not know where the bits of the significand of D0 might be, within (V0, V10), within (V1, V11), or spread across both vectors. The low order part is added without overflow detection because an overflow out of the lower bits is not a problem. The high order part has to handle a carry from the low order part, and it also detects overflow because overflow out of the upper bits is always a problem.

Example 8 HPA numbers are 384-bits wide, but the hardware handles 128 bits at a time. The HPA numbers are split into a low-order part (V0, V10), an intermediate part (V1, V11), and a high-order part (V2, V12).

ADD_HPA_DP V0, V10, D0
ADDC_HPA_DP V1, V11, D0
ADDCO_HPA_DP V2, V12, D0

Note that all three of the instructions receive the same DP number D0, for the same reasons outlined in example. Both the low order and intermediate parts are added without overflow detection because an overflow out of these parts is not a problem. The intermediate part needs to deal with a carry out of the low order part. The high order part has to handle a carry from the intermediate part, and it also detects overflow because overflow out of the upper bits is always a problem.

Example 9 the HPA numbers fit in a 128-bit value. Then subtracting a DP number D0 from an HPA number (V0, V10) is simply

SUBO_HPA_DP V0, V10, D0

Carries are not needed because there is no higher-order term, but overflow detection is important. The subtract is done in the usual way, inverting the 128-bit term that D0 as been converted into, then adding 1.

Example 10 HPA numbers are 384-bits wide, but the hardware handles 128 bits at a time. The HPA numbers are split into a low-order part (V0, V 10), an intermediate part (V1, V11), and a high-order part (V2, V12).

SUB_HPA_DP V0, V10, D0
SUBC_HPA_DP V1, V11, D0
SUBCO_HPA_DP V2, V12, D0

Note that all three of the instructions receive the same DP number D0, for the same reasons outlined in example. In this example, in all cases, the number to be subtracted is inverted (one's complement), but a carry-in for completing the two's complement operation is, in this example, only generated for the low order instruction, SUB_HPA_DP. The carry-in for completing the two's complement operation is, in this example, only set for the non-carry versions of the subtract operation, SUB_HPA_DP and SUBO_HPA_DP. At this point the instruction proceeds exactly like the add in example 3.

Converting HPA to FP

As above, we will consider the HPA number (i,a) to also have a vector representation (Vi,Va), where Vi is a vector of 64-bit integers and Va is a vector of weights Va[0]=a and Va[i]=Va[i−1]+64 for i>0. In order to convert to FP, we need to record the sign of Vi, find the first non-sign bit in Vi, construct a significand out of it and the format-specified number of following bits (52 for DP, 23 for SP), round the significand, and construct the appropriate exponent from the location of the first bit and the corresponding weight.

For simplicity, let's assume that we are converting (i,a) to DP (53 bit significand). In more detail, the conversion steps are:

1. the sign bit is the high order bit of i. If it is set the HPA number is negative, and it is negated so that it is a positive number. One way to do this is to subtract the integer part of the HPA number from zero. The original sign is remembered because it is needed for the construction of the FP number, but the rest of this conversion assumes that the value it is converting is non-negative.

2. Starting with the high-order lane, each lane does a count leading zero operation (CLZ) to determine the number of zeros before the first one in the lane. This number, the leading zero count (LZC) ranges from 0 to 63 if a one is present. If a one is found, the lane returns k=min(64−LZC, 53) bits of significand starting with that bit position, and if 64−LZC>53, the next bit to the right of the significand (G), and if 64−LZC>54, then the logical OR of all the bits to the right of G (S). All of this information from lane j is passed to the next lane j−1, along with a count 53−k of how many bits of significand to take from the high order bits of lane j−1. FIG. 5 shows how the significand is constructed from two adjacent lanes for various LZCs. If the first one is found in lane j, then we use the anchor for that lane to compute the (unbiased) exponent: e=$V_a$[j]+63−LZC.

3. the sign, exponent, significand, G and S are passed to the right until they arrive at the low order lane. Each intermediate lane (including the low order lane) updates S with the logical or of all of its bits. The low order lane constructs the DP number and rounds it according to whatever rounding mode has been specified.

The conversion HPA to FP is slightly slower than FP to HPA. If implemented as described, a 128-bit HPA number would require 3 cycles to construct a FP output: 1 cycle to make the HPA number positive, one to handle the high-order lane, and one to handle the low order lane and produce the rounded result. This is not likely to be a problem because there is one such conversion for each accumulation. For larger implementations, say 256 or 512-bit vectors, we may wish to use a more parallel approach, where the LZCs and lane results are computed all at once for each lane, and where the individual lane results are combined in a binary fashion.

Sums of Products

The constructs described above can be extended to handle sums of products. No changes are needed if we want to add rounded products: we just multiply and then add the products exactly as we would any other FP number. In order to accumulate unrounded full-length products we will need new instructions.

1. MADD_HPA_DP Vi, Va, Dn, Dk Multiply-accumulate: compute Dn*Dk without rounding (i.e., retain the full 106-bit significand product), then convert the product to HPA using the anchor values in Va, then add the converted product to Vi.

2. MADDO_HPA_DP Vi, Va, Dn, Dk Same as MADD_HPA_DP, but if the conversion or addition causes an overflow (high-order lane only in this example), set the overflow flag.

3. MADDC_HPA_DP Vi, Va, Dn, Dk Same as MADD_HPA_DP, but also respond to a carry.

4. MADDCO_HPA_DP Vi, Va, Dn, Dk Same as MADD_HPA_DP, but also respond to a carry, and if the conversion or addition causes an overflow (high-order lane only in this example), set the overflow flag.

We anticipate that, in at least some example embodiments, these instructions will take 5 cycles: three cycles for the multiplication, one for the conversion to HPA, and one for the HPA addition. The conversion is essentially the same as shown above, but with wider significands that can span three 64-bit lanes. Instead of broadcasting a single DP number to each lane, a double-length DP product is broadcast to each lane.

A multiply and convert to HPA instruction is just a MADD instruction with Vi=0. There would of course be SP variants, and possibly multiply-subtract variants.

The instructions are still fully pipelined, and can be issued each cycle, so a sum of n products would require n+4 cycles if the HPA number fits in the hardware-length registers.

Highly Accurate Inputs, and Multiplying HPA Numbers by Scalar Values

For certain applications that require high internal accuracy, such as polynomial approximations, or Taylor series, or range reduction for elementary functions, it may be useful to include more accuracy in an HPA number than can be expressed in an FP input. For example, we might want to have the constant 1/pi expressed to 128 bits or more of accuracy. This is easily accomplished by computing the desired value and storing it as a long integer (in 64-bit vector parts), together with the correct anchor. The resulting HPA number can be used just like any other.

We may wish to multiply an HPA number (i, a) with an FP number f. If f has significand s and true exponent e, then the result is an HPA number (i*s, a+e). If (i, a) is represented by the vectors (Vi, Va), then one way to do this is via vector by scalar multiplies with high and low parts.

MUL_VEC_SCALAR_low Vd, Vi, s multiplies each of the 64-bit components of Vi by the scalar 64-bit s, each lane returning the low 64 bits of the products in the corresponding part of Vd.

MUL_VEC_SCALAR_high Vd, Vi, s multiplies each of the 64-bit components of Vi by the scalar 64-bit s, each lane returning the high 64 bits of the product in the corresponding part of Vd.

The high part is then shifted so that it can be added to the low part. The anchor may be adjusted by a separate instruction that adds a and e, or a vector by scalar add that adds e to each of the entries in Va.

The product (i*s, a+e) has more bits in the integer part than the original (i,a), so it may be useful to have instructions that convert back to the original accuracy, adjusting the results anchor.

Applications

This section uses sample applications to show some of the performance and energy benefits of HPA in some example embodiments.

Application 1 Adding n FP items using HPA, where the HPA number fits in the hardware size (e.g., 128-bit HPA on 128-bit SIMD). The convert and add instructions have 2-cycle latency, and are fully pipelined with a throughput of 1 HPA addition per cycle. FIG. 6 shows the addition of 4 FP numbers to an HPA number (Vi, Va). Instructions go from top to bottom, and cycles are read from left to right, so that in cycle 1 the first add instruction is performing the FP to HPA conversion (C in the table), and in cycle 2 the converted value from the first add instruction is added (A in the table) while the second add instruction is performing its FP to HPA conversion (C).

In general, we can add n values in n+1 cycles, with the arithmetic being associative and (to the accuracy specified by the programmer) correct. In contrast, normal FP addition done according to C rules would require a×n cycles, where a is the latency of a FP add, so 3n cycles on ARM's fastest FPU. Even this understates the HPA advantage. ARM's "big" cores have two 128-bit SIMD integer pipelines, and since HPA addition is associative, we can easily use two accumulators, accumulating n FP numbers in about n/2 cycles, then adding the two accumulator values to get the final sum. This means that HPA accumulation on an ARM core can be six times faster than FP accumulation on the same core.

Application 2 Adding n FP items using HPA, where the HPA number is wider than the SIMD hardware size (e.g., 256-bit HPA on 128-bit SIMD). The convert and add instruction still has the same latency, but two convert and adds are needed for each HPA value. FIG. 7 shows the addition of 2 FP numbers to an HPA number (Vi, Va). Vi and Va are broken into high and low parts, and each FP number is first added to the low part, and then added to the high part with carry out of the lower part.

Adding n items in this way requires 2n+1 cycles, still faster than FP accumulation. As shown in application 1, we can also halve this latency by using a second SIMD unit.

Application 3 FP AMR codec. This codec spends much of its processing time in the simple subroutine Dotproduct40, which adds 40 SP products using DP, then converts back to SP. This subroutine obviously use DP for accumulation because the roundoff errors were problematic in SP. On ARM's fastest FPU, this routine would take a minimum of 126 cycles: 40 SP multiplies, 40 SP to DP converts, 39 DP adds, plus one convert back to SP. Because of C ordering rules, the DP adds alone require 39×3=117 cycles. If we do the same thing using HPA, Dotproduct40 could be done in 47 cycles on one SIMD unit: 40 HPA multiply-adds, and one convert HPA to SP. As shown in application 1, we can also halve this latency by using a second SIMD unit. Besides being faster, the HPA solution uses considerably less control logic (about ⅓ of the instructions, saving numerous fetch, decode, issue, and retire resources), so it will likely require much less power. It will certainly require much less energy.

Application 4 Dense matrix multiplication, simplest algorithm. This is a series of dotproducts, every row times every column. HPA multiply-adds could do this in a reproducible (and correct!) way on any number of processors. Speedup could again be factor of three or six on a single processor, with much larger speedups possible due to the ability to use parallelism.

Exceptions

Because of the reduced range for HPA, out-of-range numbers are much more likely. We need to provide tools and instrumentation to allow programmers to establish correct boundaries, but we especially need to provide information when boundaries are violated. We propose using underflow, inexact, and overflow exceptions, either the same exceptions used by FP or else new HPA-specific exceptions, to indicate boundary problems.

Suppose we have a 256-bit HPA number (i,a). There are two boundaries, a on the low end, and a+254 on the high end. Any FP numbers that have bits with weight less than $2^a$ are going to lose some information on conversion. This is usually not a problem because by picking the weight a the programmer has indicated that values below $2^a$ are unimportant. Nevertheless, we still need to flag the fact that bits have been lost. One way to do this is to set the inexact flag when the conversion to HPA discards some bits on the low end, and the underflow flag when the entire FP input is discarded. In this example, these computations only apply to the low order lane for the non-carrying instructions, so an implementation should be able to distinguish that lane.

Converting numbers that have bigger magnitude than $2^{a+254}$ sets the overflow exception, and this is always a serious problem, requiring the program to recompute using a different anchor. The same exception happens for overflow in the integer adder, and again the solution is to recompute using a different anchor. An HPA program should check the overflow flag to see if the program's results are meaningful.

Most accumulations use a small fraction of the range of FP numbers, and so they can be computed more quickly and correctly using HPA numbers. HPA accumulation is reproducible and parallelizable, and after figuring out data bounds, is not appreciably harder than FP for programmers. Of course in cases where FP's lack of associativity causes problems, HPA is much easier on programmers. Very few people are trained to analyze situations where FP gives poor results. One frequent response is to recode using a wider FP format, but this has poor performance for anything bigger than DP. Using HPA gives better performance and gets rid of the most pernicious of the roundoff problems.

HPA is also simple to implement, requiring modest changes to ARM's SIMD unit. While these changes add a small amount of area and power to the SIMD units themselves, at the core level power and especially energy will be much lower. Execution units are not where energy is mostly spent in an out-of-order machine, and making accumulations faster allows us to shut down the the control logic where the energy is being spent.

Figure 8:
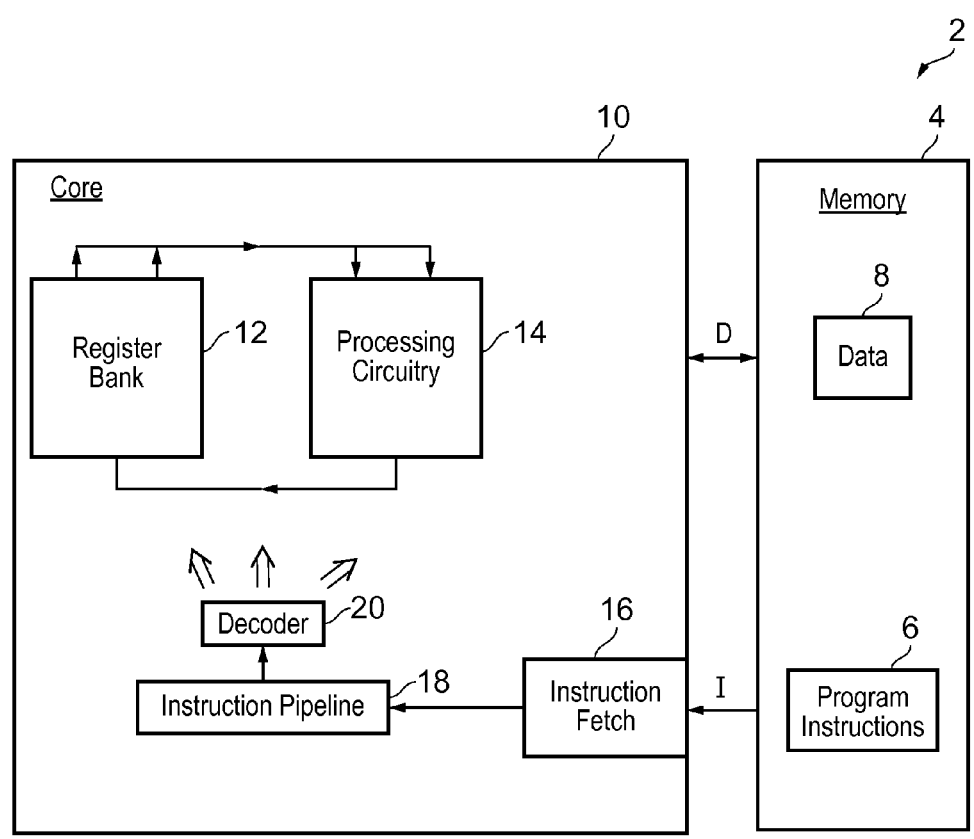
FIG. 8 schematically illustrates a data processing system.

FIG. 8 schematically illustrates a data processing apparatus 2 for performing data processing operations under control of program instructions. A data processing apparatus 2 comprises a memory 4 storing program instructions 6 and data to be manipulated 8. A processor core 10 is coupled to the memory 4 and includes a register bank 12, processing circuitry 14, an instruction fetch unit 16, an instruction pipeline unit 18 and an instruction decoder 20. It will be appreciated that in practice the data processing system 2 may include many additional elements and that the representation of FIG. 8 is simplified to aid understanding. In operation, program instructions 6 are fetched from the memory 4 by the instruction fetch unit 16 and supplied to the instruction pipeline 18. When the program instructions reach the appropriate stage within the instruction pipeline 18 they are decoded by the instruction decoder 20 and generate control signals which serve to control the operation of the register bank 12 and the processing circuitry 14 to perform the processing operation(s) specified by the program instruction decoded. Multiple input operands may be read from the register bank 12 and supplied to the processing circuitry 14 where they are manipulated and then a result value written back into the register bank 12.

The register bank 12 can have a variety of different forms. The operands to be manipulated may, for example, include floating point operands, fixed point operands, integer operands and HPA number operands (as will be described later). The register bank 12 may serve to store a mixture of these types of operands depending upon the configuration of the register bank 12. The operands can have differing levels of precision, as may be predefined by their format, or as may be programmably specified using metadata associated with the registers as will be described later in relation to the HPA number operands.

Figure 9:
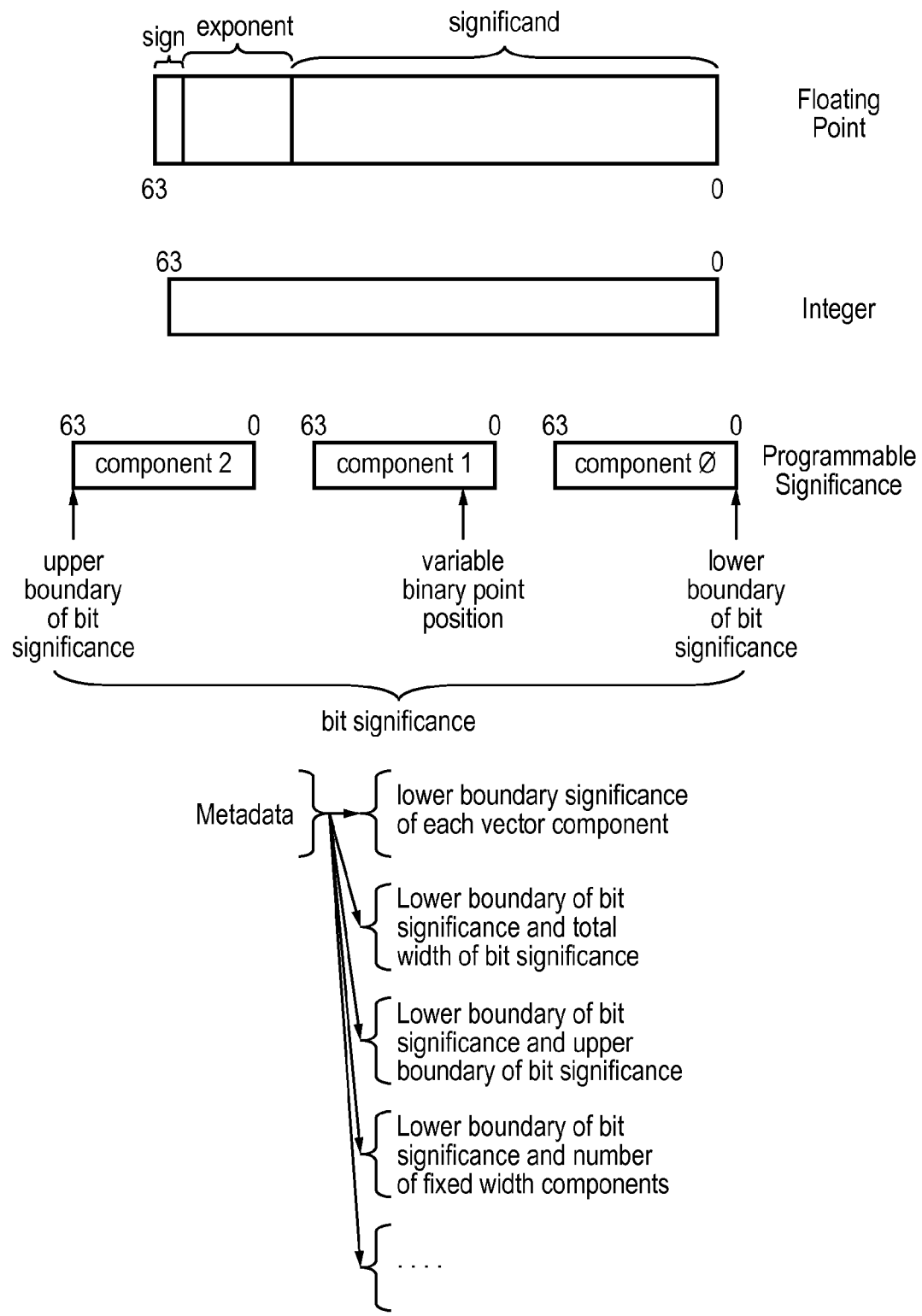
FIG. 9 schematically illustrates different formats for representing numbers to be manipulated within data processing systems.

FIG. 9 schematically illustrates a floating point operand. A floating point operand is normally formed of a sign, an exponent and a significand. Floating point operands can represent values with a wide variety of magnitudes indicated by their exponent values. The precision with which a number can be represented is limited by the size of the significand. Floating point operations typically are more complex and slower to implement than integer arithmetic.

FIG. 9 also illustrates a 64-bit integer operand. Such an integer operand can represent numbers in the range 0 to $(2^{64}-1)$ for unsigned integers, or $-2^{63}$ to $2^{63}-1$ for signed integers. Integer arithmetic is typically quick and consumes comparatively little energy to perform, but suffers from the disadvantage that numbers of a comparatively limited range of values may be specified compared to the range of numbers which may be represented by a floating point value.

FIG. 9 also illustrates an HPA number comprising a vector of multiple components (in this example three) each comprising a 64-bit integer. The HPA number has metadata associated with it. The metadata includes an anchor value indicating a programmable significance of the bits of the components forming part of the HPA number. The anchor value(s) specifies directly, or indirectly, a lower boundary of the bit significance and an upper boundary of the bit significance. The term metadata used below can be considered to correspond to data including the anchor value(s) that specify the bit significance of an HPA number. The different components together specify the bit values which contiguously span this range of bit significance. Depending upon the position of the lower boundary of the bit significance and the upper boundary of the bit significance, the range of bit significance may include the binary point position. It is also possible that the binary point position may lie outside of the range of bit significance specified for a particular HPA value.

The anchor value(s) may be provided so that they are capable of representing a range of bit significance extending from a lower boundary of bit significance corresponding to a smallest significance that can be represented by a floating point value (e.g. a double precision FP value) up to an upper boundary of the bit significance corresponding to a highest bit significance that can be represented by that floating point value.

The number of components which form the HPA number can vary between different implementations. The size of the components may be fixed in some embodiments, but in other embodiments may vary. The overall width of the range bit significance may in some embodiments be constrained to change in units of a fixed component size (e.g. with 64-bit components, the range of the bit significance may have a width of, for example, 64, 128, 192, 256, . . . ). It is also possible that the width of the range of bit significance could vary continuously in steps of one bit width.

As previously mentioned, the anchor value(s) (within the metadata) may specify the programmable bit significance in a variety of different ways. One example is to specify the lower boundary bit significance of each vector component. Thus, each vector component may comprise an integer value representing its portion of the significant bits of the value within the overall range of bit significance together with metadata representing (anchoring) the significance of the lowest bit within that component. Another option is that the anchor value(s) specifies the lower boundary of the bit significance of the whole HPA number together with the total width of the range of bit significance. A further option is that the anchor value(s) may comprise data specifying the lower boundary and the upper boundary of the range of bit significance. Still further variations are also possible, such as anchor value(s) comprising the lower boundary of the range of bit significance together with the number of the components where those components are known to be fixed width components.

Figure 10:
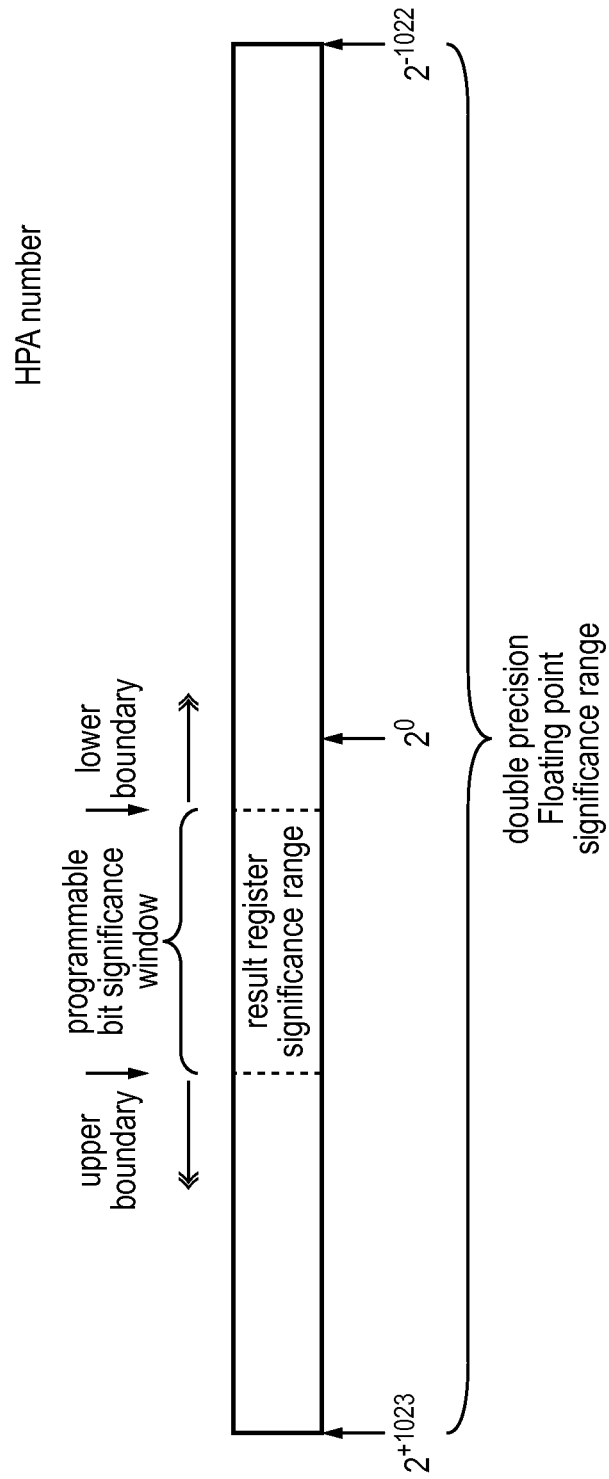
FIG. 10 schematically illustrates an example relationship between a double precision floating point value and an HPA value.

FIG. 10 schematically illustrates a relationship between size of values representable with a double precision floating point and the significance range of an HPA number. In the case of a double precision floating point number, the size of bit values which may be specified extends from approximately $2^{-1022}$ to $2^{+1023}$ (not counting subnormals). The binary value representing $2^0$ lies approximately midway in this range.

As illustrated, the HPA number has a programmable bit significance range which may be considered as a window of bit significance within the range of bit significance representable using the floating point value. This programmable bit significance may be specified by a lower boundary and an upper boundary, and depending upon the values of the lower boundary and the upper boundary, may be considered to slide along the range of bit significance provided by the floating point value. The width of the window, as well as its starting point and ending points, may be specified by appropriate values of the programmable metadata (that includes the anchor value(s)) which specifies the bit significance. Thus the HPA number may have a form selected by the programmer to match the computation to be performed.

Figure 11:
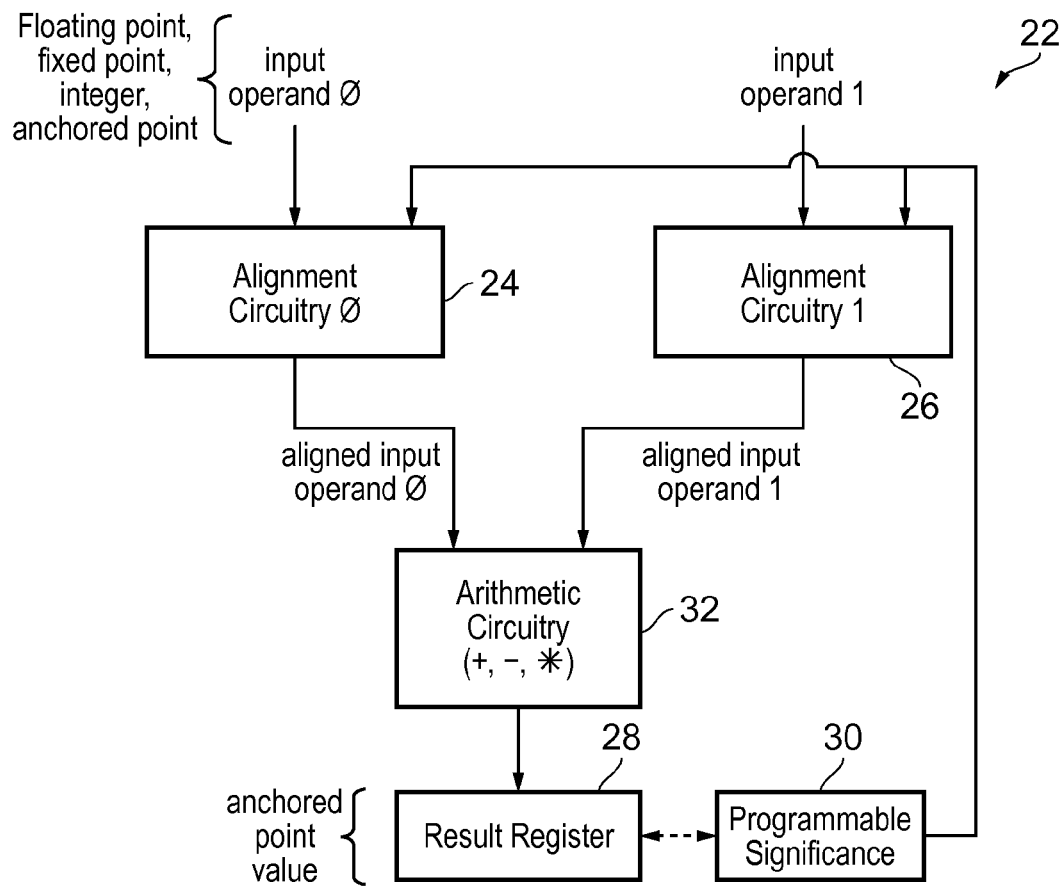
FIG. 11 schematically illustrates circuitry for aligning input operands with a result HPA register.

FIG. 11 schematically illustrates circuitry 22 which may form part of the processing circuitry 14 of FIG. 1. The circuitry 22 includes alignment circuitry 24, 26 which serves to perform alignment operations upon input operands in dependence upon the programmable significance value specified for a result register 28 and stored within a metadata store 30 (which stores the anchor value(s)) associated with the result register 28. The input operands, which may be floating point numbers, fixed point numbers, integer values, HPA numbers, or a mixture thereof, are aligned such that the values of their integer bits are aligned with the bit significance specified for the result register 28 prior to the result value which is to be stored within the result register 28 being determined. The alignment circuitry 24, 26 generates aligned input operands which are supplied to arithmetic circuitry 32. The arithmetic circuitry 32 may be, for example, an integer adder or an integer multiplier, which treats the aligned input operands as integer values and accordingly performs relatively high speed and lower energy arithmetic operations upon these aligned input operands. The result value generated by the arithmetic circuitry 32 is already aligned to the programmable significance of the result register 28 and is stored into the result register 28 as an HPA number.

In the case of one or more of the input operands supplied to the alignment circuitry 24, 26 being a floating point value, then the alignment circuitry 24, 26 is also responsive to the exponent value of the floating point value when determining how the significand of the floating point value should be aligned to match the bit significance specified for the result register 28.

It will be appreciated that as the programmable bit significance parameter (anchor value(s)) stored within the metadata storage element 30 is independent of the aligned result value generated by the arithmetic circuitry 32; there is no normalization of the HPA number performed. Accordingly, overflows, underflows and other exception conditions are possible in relation to the processing performed on the HPA numbers as will be discussed later below.

In the example of FIG. 11, the programmable significance parameter (anchor value(s)) is stored within the metadata storage element 30 in advance of processing being performed. In other embodiments, it is also possible that the programmable significance parameter for the result register 28 may be taken from the programmable significance parameters associated with one or more of the input operands if these are HPA operands, e.g. the largest of the programmable significance parameters of any of HPA input operands may be taken and used as the programmable significance parameter for the result register 28.

Figure 12:
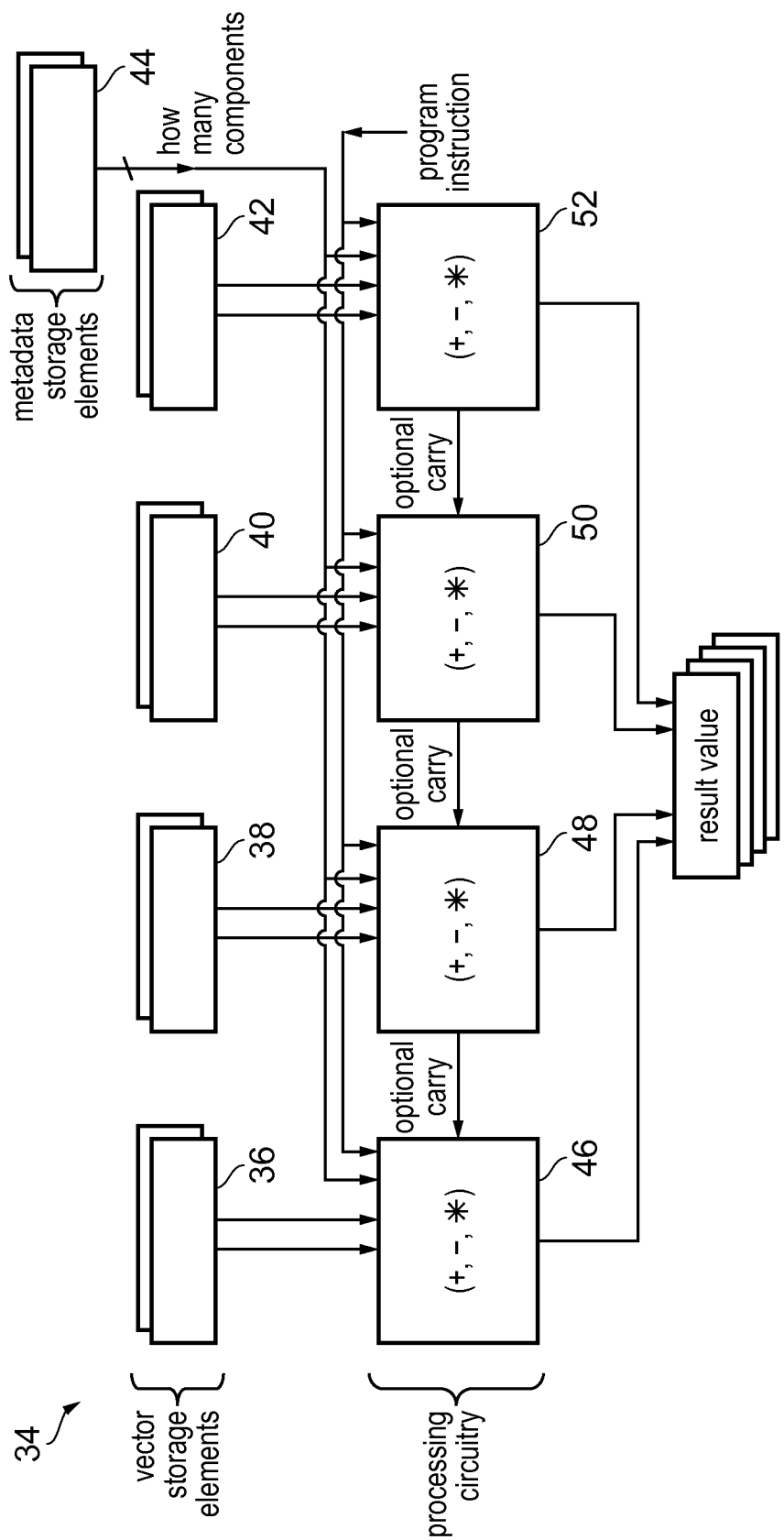
FIG. 12 schematically illustrates circuitry for performing a processing operation upon a vector HPA number in dependence upon both the number of components in that HPA number and a program instruction with the different components being processed in parallel.

FIG. 12 schematically illustrates circuitry which may form part of the processing circuitry 14 of FIG. 1 in some example embodiments. This circuitry 34 performs processing upon an HPA number in the form of a vector comprising multiple components stored within respective vector storage elements 36, 38, 40, 42. A metadata storage element 44 (e.g. metadata register) serves to store metadata including at least how many components form a particular vector HPA number. The lowest significance component of the vector is stored within the vector storage element 42 and then higher order significance components are stored within the vector storage elements 40, 38, 36 as necessary.

The circuitry 34 further comprises processing circuitry 46, 48, 50, 52 associated with respective components of the vector HPA number and which may be arranged to perform operations such as addition, subtraction and multiplication as specified by a program instruction being executed. In practice, the processing performed by the processing circuitry 46, 48, 50 and 52 is dependent upon both how many components comprise the vector HPA number value and the program instruction being executed. In particular, when a vector HPA number is composed of multiple components, then a carry out value is propagated between the different parts of the processing circuitry 46, 48, 50, 52 starting from the least significant bit end.

In the example illustrated in FIG. 12, four separate lanes of processing are illustrated. If the vector HPA number comprises four components, then all of these four lanes may be used in parallel. It is also possible that if the HPA numbers comprise two components, then two such two-component HPA numbers may be processed in parallel within the circuitry of FIG. 12 with a carry not being performed between the components of the processing circuitry 50 and 48.

Figure 13:
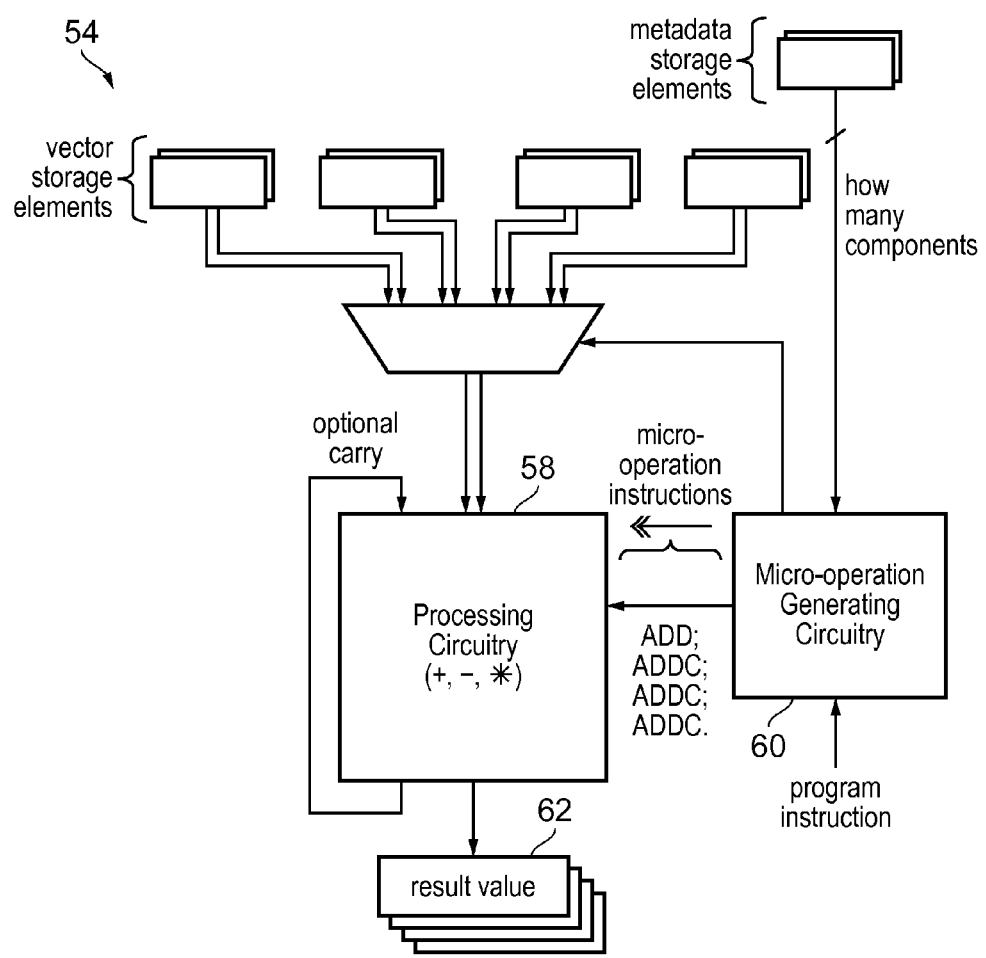
FIG. 13 schematically illustrates circuitry for performing a processing operation upon a vector HPA number in dependence upon both the number of components in that HPA number and a program instruction with the different components being processed in series.

FIG. 13 illustrates a variant of the circuitry of FIG. 12. In the circuitry 54 of FIG. 13, a vector HPA number value is again subject to processing as specified by a program instruction. In this case the processing circuitry 58 is controlled by micro-operation instructions generated by micro-operation generating circuitry 60 in dependence upon the program instruction and the metadata indicating how many components are within the vector HPA numbers. In particular, if four pairs of components need to be added to perform the addition between two four-component HPA numbers, then these four additions are performed in series by the processing circuitry 58. The first of these additions does not have a carry in input and may be represented by a micro-operation instruction ADD. The next three additions do receive a carry input from the previous addition and may be specified by the micro-operation instructions ADDC. The final result vector HPA number is written into the result register 62.

Figure 14:
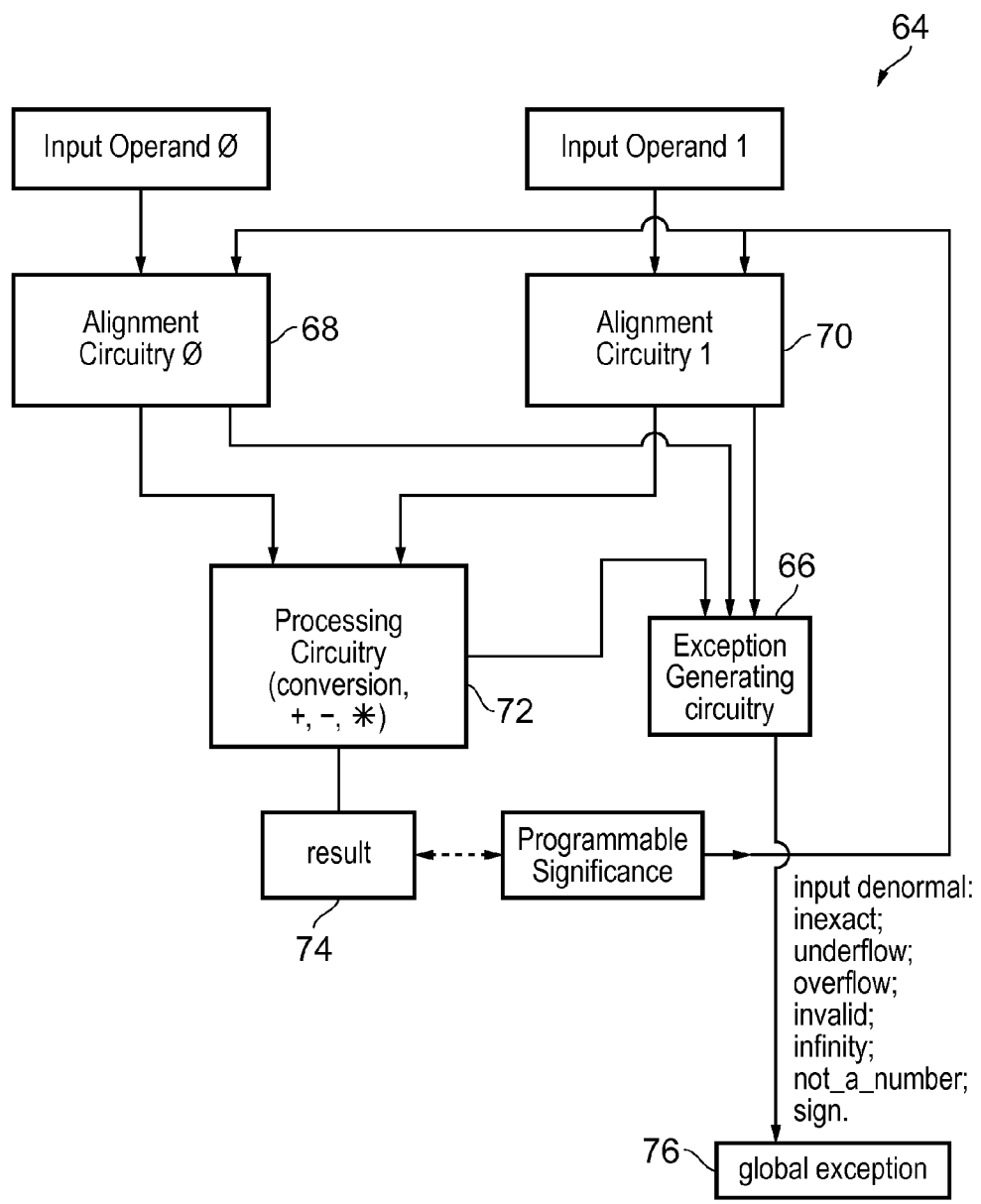
FIG. 14 schematically illustrates exception indication generation in respect of processing performed using HPA numbers.

FIG. 14 schematically illustrates circuitry 64 which may form part of the processing circuitry 14 of FIG. 1. The circuitry 64 is similar to that of FIG. 11, but in this case additionally includes exception generating circuitry 66. The exception generating circuitry 66 is responsive to inputs from the alignment circuitry 68, 70 and the processing circuitry 72 to identify the occurrence of a variety of exception conditions. These exception conditions may include one or more of the conditions that: one of the input operands is a subnormal floating point number; the conversion of a number between formats has been inexact; a result value generated has underflowed the programmable significance range of a result register 74; a result value generated has overflowed the programmable range significance of the result register 74, an input operand has a value of infinity; is not a number; or is a signed value when being converted to a target value that is unsigned. It will be appreciated that various other forms of exception indications are possible. The exceptions when they occur may be noted within a global exception store 76. Alternatively, exceptions may be associated with individual HPA numbers and form part of the metadata associated with those HPA values. Other arrangements are also possible.

At least some embodiments of this disclosure include a method for handling conversion and arithmetic exceptions for HPA numbers that represent floating-point (FP) values. A goal of some embodiments may be to produce the same exceptions (except for inexact) that would be produced when adding FP numbers (e.g., +infinity added to −infinity returns a NaN and the invalid operation exception IOC), as well as giving the programmer information needed to detect whether the significances specified by the anchor vectors are too small.

The use of HPA datatypes to represent full-width or partial-width floating-point values raises issues with IEEE 754 exception handling. Table 2 contains entries for FP exceptions except DZC (divide by zero, an exception that happens during division, not conversions), as well as meta-data entries for infinity, NaN, and sign. These exceptions may be recorded immediately in a global exception word, or after the HPA datatype has been converted to a standard FP datatype (SP or DP), or never recorded in the global word. They may be incorporated in the metadata for the datatype or not. Some are non-standard exceptions while the others are IEEE 754 specified.

The FP->int and int->FP columns of Table 2 show what happens during IEEE-754 conversions between FP and 64 or 32-bit integers. These are included to provide guidance as to IEEE-754 behavior. The last three columns show which exceptions are possible for the conversions and additions involving HPA values, as well as how these operations can deal with infinities and NaNs.

If the HPA number vector is large enough to exactly represent the FP type, then most of the exceptions will not happen. There is a unique HPA number for every finite FP number and so overflow and underflow should not occur, and even inexact should not occur for conversions to HPA numbers. Addition and subtraction can't cause underflow, and they are exact, so no exceptions should arise. Finally converting back to FP should not underflow if the full HPA precision is used.

Overflow can happen for both addition and conversion back to FP. Simply adding the HPA equivalent of the maximum positive FP number to itself will give a result that might overflow the addition (depending on how many bits we give to the HPA number), and it will overflow the conversion back to FP.

If using smaller vectors (something programmers will want to do for performance reasons), then more of the exceptions become possible. Furthermore, these exceptions become meaningful to programmers, because the one possible aim for this arithmetic is to be reproducible and exact. In general, seeing an overflow, an underflow or an inexact indicates that larger vectors are needed to store the HPA numbers.

Table 2 is an example of one embodiment handling/generating exception indication; other definitions of exception bits and other situations may be possible. The column "FP->int" is conversion of standard floating-point datatypes (e.g., SP and DP) to the standard integer formats (full or arbitrary precision); "int->FP" is the reverse conversion; "FP->AHP" is conversion of a standard floating-point format or the computed products of FP values to an HPA datatype; "HPA->FP" is the reverse conversion for an HPA datatype to a standard FP format; and "AP add/sub" considers addition or subtraction of HPA data.

Table 2 indicates which exceptions are possible (indicated by y), which exceptions can't happen (indicated by n for no or NA for not applicable), and the footnotes explain the exceptional behavior in more detail.

TABLE 2

| exception, metadata | FP->int | int->FP | FP->HPA | HPA->FP | HPA add/sub |
|---|---|---|---|---|---|
| idc (input subnormal) | y | NA | y | y | NA |
| ixc (inexact) | y | Y | y (f) | y | NA |
| ufc (underflow) | n (a) | NA | y (g) | y | NA |
| ofc (overflow) | n (b) | NA | y (h) | y | y |
| ioc (invalid) | y (c) | NA | y (i) | NA | NA |
| inf (infinity) | (d) | NA | metadata (j) | metadata (j) | metadata (j) |
| NaN (not a number) | (e) | NA | metadata (j) | metadata (j) | metadata (j) |
| Sign | NA | NA | metadata (j) | metadata (j) | metadata (j) |

(a) Numbers smaller than integers are converted to zero, without setting exception flags.

(b) Numbers larger than the integer can hold are converted to the maximum positive or maximum negative integers, and ioc is returned rather than ofc.

(c) Numbers larger than the integer can hold, negative numbers converted to unsigned formats, input infinity, or input NaN are all invalid. The integer returned is zero or maximum positive or maximum negative.

(d) These are converted to the maximum positive or maximum negative integers, returning IOC.

(e) These are converted to zeros, returning IOC.

(f) Given a large enough destination vector, this exception won't happen, but a programmer can specify a smaller destination (say the programmer knows all inputs are in the range $2^{-100}$ to $2^{+100}$). This flag indicates that the programmer was incorrect.

(g) Like (f), this flag can indicate a programmer error, namely that the input value is smaller than what can be represented in the given anchored point range. Depending on what the programmer is trying to do, this may or may not be serious (e.g., the programmer might want to disregard tiny numbers). In some implementations, the combination of IXC and UFC gives additional information: UFC only means none of the bits were converted, while UFC and IXC means a partial conversion. No attempt is made to round partial conversions.

(h) This flag indicates a serious problem, namely that the input value is larger than what can be represented in the given HPA vector. As in (g), we will use the IXC flag to indicate partial success in the conversion, but in all cases this flag says we need to try again with larger HPA vectors.

(i) This flag indicates a serious problem. We propose setting it for input infinity or NaN, and (if we make an unsigned HPA format) for conversion of negative non-zeros to unsigned HPA format. Input infinities or NaNs should also adjust the metadata flags.

(j) See the discussion of metadata below. In order to give the same results as FP computations involving the symbols infinity and NaN, we need some indication that the given numbers are infinities or NaNs, as well as the signs of the infinities. These together with some record of exceptions generated during the production of the HPA number are best stored with the HPA number, ideally as part of the second metadata vector.

At least some embodiments of this disclosure includes using SIMD-like hardware to add or subtract HPA numbers or integers, i.e., numbers wider than 64 bits. Using scalable registers it may be possible in some implementations to add numbers that are thousands of bits long, with single-cycle addition of whatever the implemented vector length is (at least for likely implementations).

A SIMD-like system may contain scalable vector registers, and those registers can contain multiple 64-bit values. It is proposed that for the purposes of new add and subtract instructions, the scalable vector register be considered to be one long 64*n-bit two's complement integer instead of a register of n 64-bit numbers. Following a SIMD scheme, the addition or subtraction is split by hardware into implementation-defined chunks (e.g. 256 bits or 512 bits) and added from low-order chunks to high-order chunks. Each chunk may execute in a single cycle (at least up to 1024-bits chunks).

If a chunk generates a carry out, then that carry out may be an input into the next chunk. This can be indicated/controlled using predicate condition flags. This is a nonstandard use of predicate conditions.

Each addition or subtraction on a chunk would both read and write the carry predicate condition flag (hereafter referred to as PCARRY), setting a carry-in to the addition or subtraction if PCARRY was set, and then setting or clearing PCARRY based on the presence of a carry out from that chunk.

Subtraction can be done in the usual two's complement way, i.e., A−B=A+~B+1. The +1 would be handled as a carry-in to the low-order chunk (this is unused because there is nothing of lower order to generate a carry).

The single-cycle addition on a chunk would likely be done using the existing 64-bit adders, with carry-select logic used to extend the addition to whatever the chunk size is. An example of a 256-bit adder constructed from several 64-b adders is shown in FIG. 1.

An alternative "carry-lookahead" approach (as illustrated in FIG. 2) can be utilized to accelerate the carry inputs along the adder, as shown in FIG. 2, where $g_n$ is a 64-b carry generate signal, $p_n$ is a 64-b carry propagate signal and $G_{n:0}$ is a carry signal that combines all the 64-b adder generate and propagate signals from significance 64×(n+1) down.

The carry-lookahead approach may enable single-cycle execution of sums of size up to 1024-bits.

If the Add/Subtract instructions also used a predicate register, a predicate bit may be used to control whether or not carries could propagate at any given 64-bit boundary. This would allow a vector to contain multiple 128-bit or larger integer values. So a 1024-bit vector register could be regarded as sixteen 64-bit values, or four 256-bit values, or a single 1024-bit value, and a single add instruction would work correctly in all cases.

One possible implementation of this would be to have a predicate bit meaning "enable PCARRY", which when set for any 64-bit element would allow a carry-in to that particular adder. Subtractions (A−B) in this more general scheme are implemented by inverting B (at all 64-bit positions) and adding 1 at those locations for which the "enable PCARRY" bit is not set.

This scheme would allow the existing add instruction to work just as it does currently (if no "enable PCARRY" bits were set), but would also allow the input vectors to be interpreted as containing any mix of higher-precision numbers. Consider the addition of 512-bit vectors along with a predicate that contained "enable PCARRY" bits as in Table 3:

TABLE 3

|  | PC7 | PC6 | PC5 | PC4 | PC3 | PC2 | PC1 | PC0 |
| --- | --- | --- | --- | --- | --- | --- | --- | --- |
| (a) 8 × 64 bits | 0 | 0 | 0 | 0 | 0 | 0 | 0 | 0 |
| (b) 4 × 128 bits | 1 | 0 | 1 | 0 | 1 | 0 | 1 | 0 |
| (c) 2 × 256 bits | 1 | 1 | 1 | 0 | 1 | 1 | 1 | 0 |
| (d) 1 × 512 bits | 1 | 1 | 1 | 1 | 1 | 1 | 1 | 0 |
| (e) 1 × 256 and 2 × 128 bits | 1 | 1 | 1 | 0 | 1 | 0 | 1 | 0 |

In case (a) none of the new predicate bits (denoted PCi) are set, so the addition is interpreted to be separate additions of each of the 8 64-bit values.

In case (b), the predicate bits allow carries from the even 64-bit registers to the odd 64-bit registers, which means that the additions are now working on 128-bit values.

In (c) and (d) these carries are allowed for progressively larger numbers.

Case (e) shows that even mixed interpretations are possible for a given vector.

Figure 15:
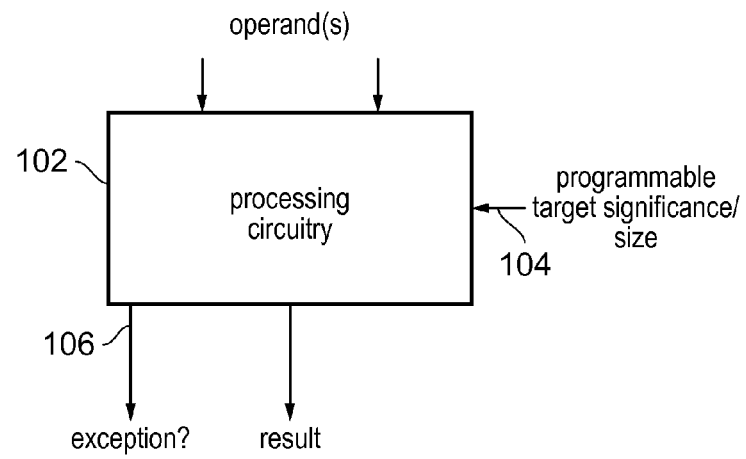
FIG. 15 illustrates an example of an apparatus having processing circuitry for generating a result based on a target significance and/or target size specified by programmable control data.

FIG. 15 shows an example of an apparatus comprising processing circuitry 102 which receives one or more operands and generates a result in response to the operands. The processing circuitry receives programmable control data 104 specifying at least one of a target significance and a target size (length) for the result value. In response to the programmable control data C4, the processing circuitry 102 generates the result value having the target significance and/or target size irrespective of the values of the operands supplied to the processing circuitry 102. If performing a processing operation (e.g. a multiplication or addition) on the input operands would give a value which is not representable in the result value having the specified target significance and target size, the processing circuitry may output an exception signal 106 to indicate that the result value is not exact. For example, the exception indication may indicate one of:

an overflow condition when the result of the processing operation is larger than can be represented using the result value of the specified significance and size;
an underflow condition when the result is smaller than can be represented by the result value having the specified significance and size; or
an inexact condition when the result is more precise than can be represented using a value having the target significance and size.

Figure 16:
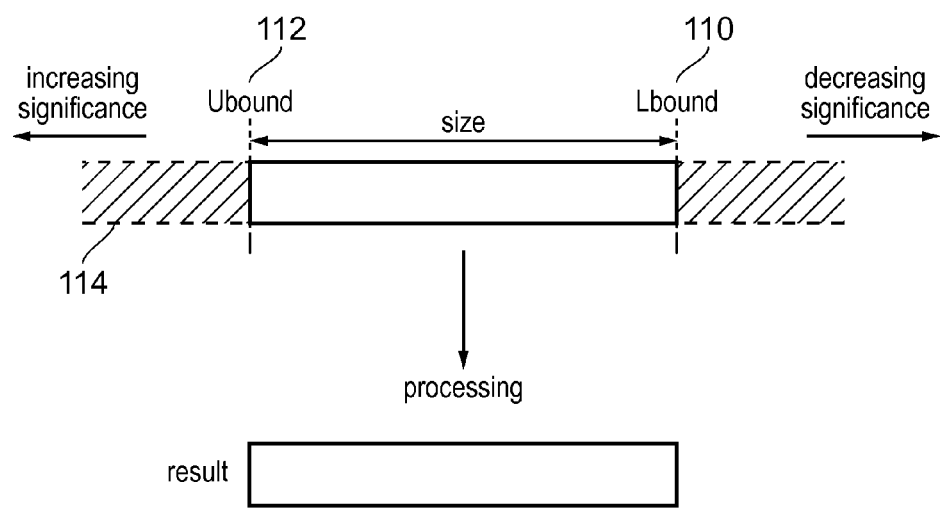
FIG. 16 illustrates an example of setting upper and lower significance boundaries for an arithmetic operation.

It may seem counter-intuitive that the processing circuit should be allowed to generate a result of a specified significance even if the true result of processing lies outside that significance. However, as shown in the example of FIG. 16, this can be useful for limiting the amount of processing required so that it is not necessary to process very large numbers if the result is generally expected to fit within a smaller number of bits. For example, the control data 104 may specify one or both of a lower significance boundary 110 and an upper significance boundary 112. The processing circuitry 102 may limit its processing so that it determines the bit values of the result value lying within the specified significance boundaries 110, 112 and does not determine bit values lying outside the boundaries. Hence, while the result value has a format that can represent numbers in a wide range of a number space 114, the control data 104 defines a window of variable length and position within the number space, and the processing circuitry 102 calculates only the bits within the specified window, to speed up processing and reduce energy consumption. For example, the programmer may know that valid operand values and results are expected to lie within a certain range of significance, and so by setting the control data appropriately, processing resources are not wasted in calculating bit values which are less significant or more significant than the expected range. Nevertheless, the window within processing is performed can be adjusted by changing the programmable control data so that a wide range of values can be supported, but with smaller hardware overhead.

In some cases the size of the result value may be fixed, and the control data 104 may specify only one of the lower and upper significance boundaries 110, 112, with the other one being determined from the specified boundary and the known result size. Alternatively the size may be variable and may be specified explicitly in the control data 104 or may be expressed as a multiple of a certain number of bits (e.g. 32 or 64 bits). In another example, the control data 104 may specify both the lower and upper significance boundaries 110, 112, which effectively identifies the size as the difference between the boundaries. Hence, there are a number of ways in which a target size and target significance for the result value can be determined from the control data.

Figure 17:
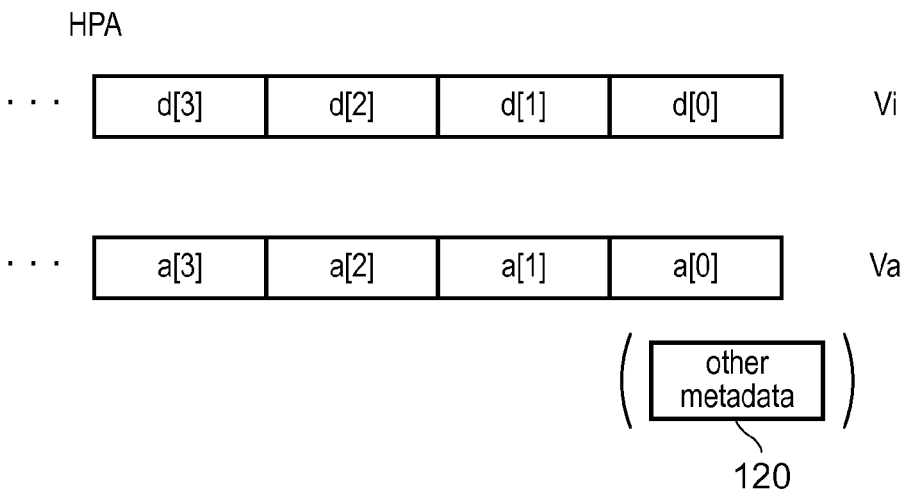
FIG. 17 illustrates an example of a high-precision anchored (HPA) data format.

FIG. 17 illustrates an example of a data value in a high-precision anchored (HPA) data format. The HPA number comprises a data vector Vi comprising a number of data elements d[0]-d[3] each comprising a two's complement number representing a respective portion of a binary value (which is unnormalised), and a metadata vector or "anchor" vector Va including anchor value elements a[0]-a[3] each specifying the significance ("weight") of the corresponding data element in the data vector Vi. For example each anchor value element a[i] may specify the significance of the least significant bit in the corresponding data vector Vi. While FIG. 17 shows an example where the vectors Vi, Va comprise 4 data elements, which may be of a certain element size such as 64 or 128 bits, it will be appreciated that the vectors may have varying numbers of data elements. The number of elements in the vector may be indicated within the anchor value Va, e.g. by providing a predetermined bit pattern or status flag in the anchor value element a[i] of any vector lanes which are not being used, so that the number of elements to be processed is indicated by the anchor value elements not having that bit pattern. For example a anchor value vector Va having weights (X, 118, 54,−10), where X is the bit pattern or status flag indicating an unused lane, may indicate that the 64-bit data elements d[2], d[1] and d[0] together represent a 192-bit binary value with a least significant bit of significance $2^{-10}$ and a most significant bit of significance $2^{181}$. Alternatively, the HPA number may have some further metadata 120 specifying the number of elements to be processed in this HPA number. Also, the anchor value vector Va or the further metadata 120 may also specify other information such as the sign of the data value represented by the data vector Vi, exception information indicating any exception conditions which may have arisen during processing of the vector (e.g. overflow, underflow, inexact, invalid operation or input subnormal exceptions), or characteristic information indicating for example whether the data value is infinity, Not a Number (NaN), or zero. When adding or subtracting HPA values, the anchor value is fixed for the various inputs to the addition/subtraction, and the result is generated with the same anchor value. This means a simple fixed-point adder can be used to process the HPA values, so that floating-point addition circuitry supporting rounding and normalization is not required, which can be make processing a series of additions or subtractions faster. The anchor value is used when converting between the HPA format and other formats such as floating-point or integer or fixed-point formats, to generate values having the appropriate significance. Representing the value as a vector in this way is useful because it allows the processing of variable length values of varying significances to be processed efficiently without requiring a very large accumulator (e.g. see FIG. 19 below).

Figure 18:
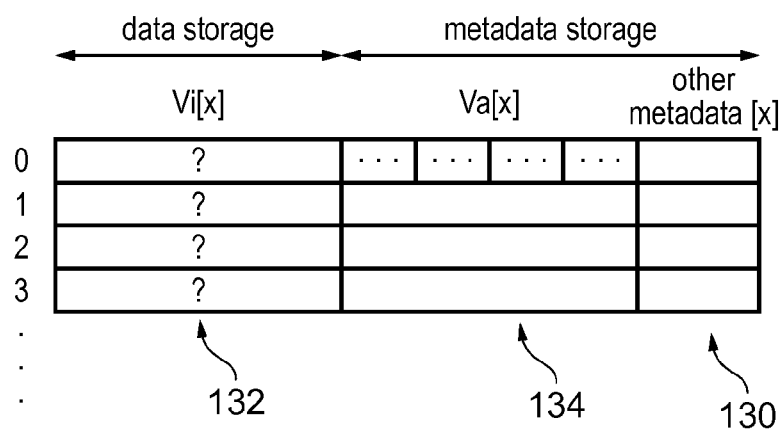
FIG. 18 shows an example of a metadata storage element for storing metadata (including an anchor value a) indicating a target significance for a data value to be stored in a corresponding data storage element.

FIG. 18 illustrates an example of a storage unit (e.g. a register file) 130 for supporting data values in the HPA number format. The apparatus shown in any embodiment of this disclosure may be provided with the storage unit shown in FIG. 18. The storage unit includes a number of data storage elements (registers) 132 which each have a corresponding metadata storage element (register) 134. In some examples the metadata registers 134 may be in a separate register file from the data storage registers 132. Alternatively, the data registers and metadata registers may be part of a single register file or may comprise different parts of the same register. Each data storage register 132 may store the data vector Vi for a given HPA number. The corresponding metadata storage register 134 stores the anchor vector Va and any further metadata 120 (if provided) for that HPA value.

In some examples, the metadata in the metadata storage register 134 may be considered to be associated with the corresponding data storage register 132 itself rather than the particular data value in the corresponding data storage register. That is, the anchor value Va may be defined for a given register before any value is actually calculated for storing in the data storage register. When performing a processing operation specifying one of the data storage registers 132 as a destination register, the processing circuitry 102 may read anchor values from the corresponding metadata register 134 and generate the result value having the target significance and/or target length specified by the anchor value(s), independently of the value or significance of any inputs to the processing operation. The anchor value is programmable based on control data supplied by a programmer. In some cases the programmer may specify the anchor value directly, while in other examples a library or other software program may convert control data input by the programmer into anchor value(s) of a suitable format which can be read by the processing circuitry 102 (this approach allows the programmer to set the anchor values without having to understand the internal metadata format used by the hardware).

If the HPA number requires more elements than can be stored in a single data register 132, then the HPA number may span multiple registers with the corresponding metadata identifying how many registers correspond to the HPA number and defining the significances of the portions of a given binary value represented by each data element.

Figure 19:
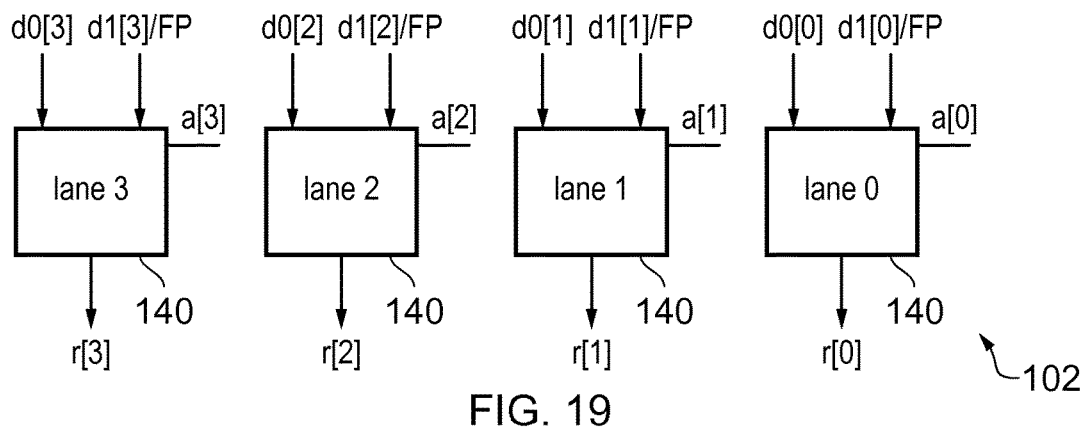
FIG. 19 shows an example of processing circuitry comprising a number of processing units for performing parallel lanes of processing.

FIG. 19 illustrates an example of processing circuitry 102 for processing numbers in the HPA format. The processing circuitry 102 may have a number of processing units 140 for performing parallel lanes of processing (e.g. conversion or arithmetic operations) on respective data elements of the data vector Vi, based on the anchor value in the corresponding metadata vector Va of a given HPA number. In some cases the processing circuitry 102 may operate on two HPA numbers and each lane may receive corresponding elements $d0[i]$, $d1[i]$ of the two HPA numbers. In this case, the HPA numbers share the same anchor value and corresponding data elements $r[i]$ of the result are generated to produce a result value in the HPA format which also has the same anchor value as the inputs. It is possible to map HPA numbers with different anchor values to HPA numbers having the same anchor value before performing the processing.

Alternatively, in response to an instruction specifying as source operands one HPA number and a floating-point number, the floating-point number (or a floating-point number obtained from an arithmetic operation performed on multiple floating-point operands) can be mapped to the HPA format before being combined with the other HPA number. Each lane receives the corresponding anchor value $a[i]$ of the anchor vector Va and this may control how the floating-point operand FP is mapped to a corresponding element of an HPA number.

The number of elements processed for a given calculation may vary depending on the metadata. While processing units 140 are provided for a certain number of lanes, if not all the lanes are required for a particular calculation, the unused lanes may be power gated or provided with zero inputs to prevent toggling of internal bit states within the lane, to save power. On the other hand, if the metadata or anchor value specifies a greater number of elements than the number of processing units 140 provided in hardware, then the HPA number may be processed in multiple passes of the hardware.

In summary, the high-precision fixed-point arithmetic system described herein incorporates the "high-precision anchored" (HPA) datatype. The HPA datatype may be a pair of vectors, one containing the data as an ordered set of fixed-length integers (e.g., an ordered set of eight 64-bit integers), and the other containing metadata (anchor values) specifying how each one of the fixed-length integers is to be interpreted by hardware (e.g., range information giving the exponent weight of each bit in the integer). Since each lane receives both data and metadata specific to that data, the lanes can do different operations that produce a meaningful result for the vector as a whole. For example, an HPA value may represent a very long integer, e.g. 200 to 4000 bits long, which represents a floating-point number or product in fixed-point form. The anchor element associated with each 64-bit part of that long integer tells a 64-bit lane how to interpret that 64-bit integer. Hence, a datatype is provided consisting of data and the metadata associated with the data, and the ability to create multiple data items each with metadata specific to that data item.

The HPA data may be the full size datatype or a portion of the range and precision of the full size data type. The full size datatype could be 2099 bits (for holding all double-precision numbers), or 4198 bits (for holding all double-precision products), for example, or some even larger size allowing us to add many of these values without overflowing. Clearly this is a large number of bits, and operations on these datatypes would require multiple cycles, and storage would be significant. However, in many cases, the function or application being executed will not require the full datatype, but only a portion of the datatype, and this will be known to the programmer through numeric analysis and simulation. For example, a particular program might never have subnormal inputs, or might have some other range limitations. In these cases, we can use smaller HPA data.

This datatype may be defined by only a few characteristics. These include the size of the datatype, in some cases in bits or multiples of a vector lane size, or it could also be defined in terms of a fixed data size, such as 32-bits or 64-bits. Further, the datatype may be defined by the lowest exponent that can be represented. For example, if the algorithm processes single-precision data in the range [+/− $10^{25}$, $10^{45}$], and all intermediate computations are in the same range (the range for intermediate computations could be greater or smaller than the input data range, but the final range should in most cases incorporate the extents of both ranges), then the datatype would contain only the number of bits necessary to represent data within this range. In this example, $10^{25}$ is slightly larger than $2^{83}$ and $10^{45}$ is just smaller than $2^{150}$, so an appropriate datatype for this algorithm would be 91 bits (150−83+24) and the anchor value would identify the smallest exponent representable as 83. Summations to this data item would involve the 91 bits of the datatype and not the full 2099 bits, resulting in greatly reduced computation time and storage requirements.

In order to process floating-point exceptions, it can also be useful for the metadata for each HPA number to include at least the following information:

sign (whether the value is positive or negative)

exception bits, e.g. IEEE 754-2008 defined bits—IXC (inexact exception), IOC (invalid operation exception), UFC (underflow exception), OFC (overflow exception); or implementation-defined bits—IDC (input denormal exception). A DZC (division by zero) exception bit may not be required if division of HPA numbers is not required.

characteristic bits (e.g. indicating whether the value is infinity, NaN (Not a Number), zero)

These bits would be part of the datatype, and would not necessarily be duplicated for every lane.

Figure 20:
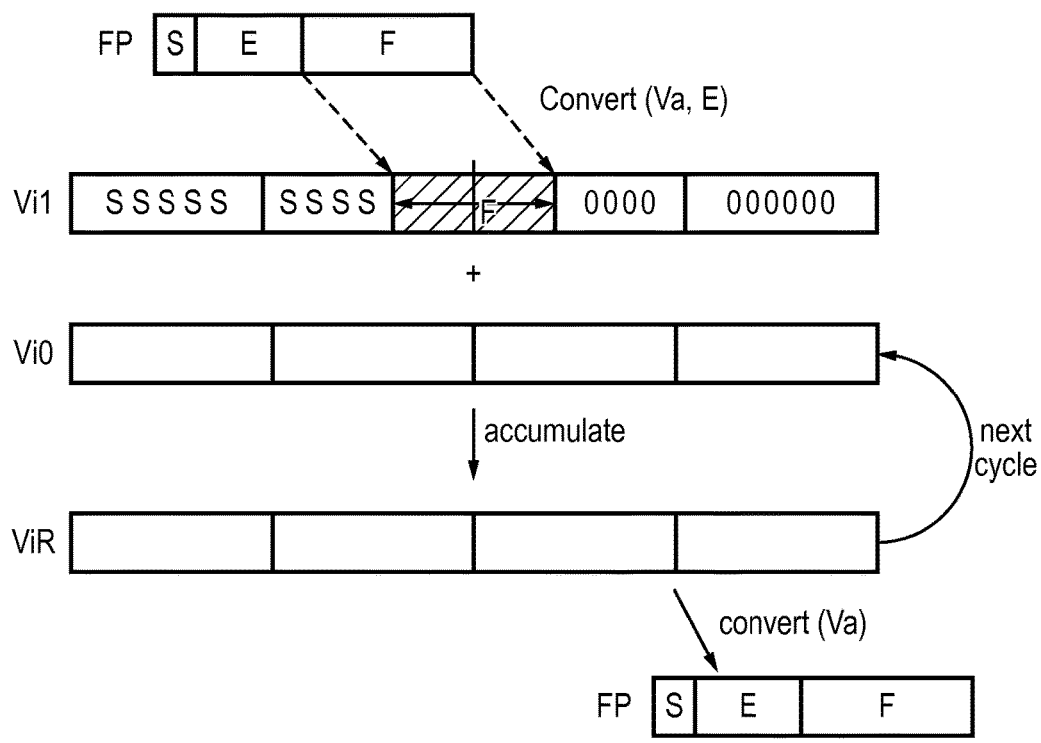
FIG. 20 illustrates an example of an accumulation operation for adding a series of floating-point values.

FIG. 20 shows an example of an operation which may be performed using an HPA value. In this case the operation is an accumulation operation to find the sum of a series of floating-point values. If these were processed in floating-point arithmetic, then the order in which the floating-point values are added would affect the result since each addition of a pair of floating-point values may result in imprecision due to rounding and normalization, and so floating-point additions are not associative. Therefore, to give a predictable result, accumulating a series of floating-point values using floating-point addition would require the additions to be performed sequentially in a fixed order, which makes it difficult to perform quickly.

In contrast, by using the HPA format the performance can be improved greatly because additions of HPA numbers are associative and so even if some additions are performed in parallel within a multi-processor system, or the additions are reordered depending on which operands become available first, the result will still be correct and repeatable. FIG. 20 shows the steps performed in one addition, which may then be repeated a number of times to accumulate each floating-point value. In each addition, an input floating-point value FP is mapped to a data vector Vi1 in the HPA format, based on programmable anchor vector Va specified in advance for the HPA number. The significand F of the floating-point value FP is mapped to a portion of one or more elements of the data vector Vi1, depending on the significance boundaries defined in the anchor vector Va and an exponent E of the floating-point value. As the vector is much larger than the significand F of the floating-point value, typically only a few lanes of the vector would be populated with bit values from the significand, with higher lanes populated entirely with sign bits and lower lanes populated with zeroes. The conversion operation will be discussed in more detail below.

Hence, the converted data vector Vi1 is effectively a long fixed-point value which provides an alternative representation to the binary value represented by the floating-point value. This means that it can be added to another data vector Vi0 in the HPA format (which has the same anchor value as Vi1) by simple integer addition, without requiring alignment, normalisation, rounding and exponent adjustment steps as for floating-point arithmetic. This means that the addition operation is associative with other additions and so can be performed in parallel or can be reordered to improve performance. A vector ViR is generated by adding the data vectors Vi0, Vi1, and this represents the data vector of a result value in the HPA format having the same anchor vector Va as Vi0, Vi1. If this is not the last addition of the accumulation, then the result vector ViR becomes the second vector Vi0 for the next addition, when another floating-point value FP is input and converted to HPA format and added to the previous accumulation result. By repeating these steps several times a series of floating-point values can be added very quickly without loss of precision, which is not possible with floating-point arithmetic. Having generated the final accumulation result, the data vector ViR of the result may then be converted back to a floating-point value if desired, with the anchor vector Va controlling the way in which the conversion is performed so that the floating-point value represents a binary value corresponding to the result value (with rounding if necessary).

Hence, a floating-point (FP) number or product may be converted to a high-precision anchored (HPA) number. These HPA numbers can be hundreds (single precision) or thousands (double precision) of bits long, but they may be exact representations of the FP inputs, and unlike FP numbers these numbers obey the normal associative properties of arithmetic.

The conversion from a FP number to an HPA number will now be discussed in more detail. Single-precision floating-point (SP) numbers comprise a sign bit, 8 exponent bits, and 23 fraction bits. There is also a hidden bit (based on the exponent) that is used to construct a significand of form 1.fraction or 0.fraction. The largest exponent and the smallest exponent are reserved for special numbers, but the first bit of the significand can appear in any of the other $2^8-2=254$ positions specified by the exponent. The first bit of the significand is followed by the fraction, and there is one additional bit to represent the sign, so any finite SP number can be represented as a 254+23+1=278-bit fixed-point number. If we were to construct a vector of five 64-bit values to hold this number, the low-order vector element would hold bits 0-63, the next element would hold bits 64-127, and so on, with the high order element holding bits 256-279.

How does this fit into a vector processor? Suppose we have an instruction for converting a SP floating-point number Si to an HPA number Vi, Va (where Vi is the data vector and Va is the anchor vector):

CVT_SP_to_HPA Vi, Va, Si

Vi will contain the 279-bit fixed-point result. Va will contain boundary information for each of the five 64-bit destinations in Vi, so in the example above Va=<256, 192, 128, 64, 0>. Each 64-bit lane will get a copy of the SP number Si, and it will use the boundary information and the exponent of the SP number to compute which bits to set in the appropriate portion of Vi. Let Vi=<D4, D3, D2, D1, D0>. If Si has exponent 70, bits [70:64] of Vi (i.e., bits [6:0] of D1) will be set to the top 7 bits of the significand of Si, and bits [63:47] of Vi (i.e., bits [63:47] of D0) will be set to the bottom 17 bits of the significand of Si. All of the remaining bits would be set to zeros (for simplicity let's assume a positive number for now). Each lane receives the complete significand, the exponent, and the boundary information from the corresponding entry of Va.

In the usual case, Va is completely determined by the base value in its low order 64-bits, with each successive 64-bit value being 64 more than the value in the previous 64 bits, so we could get by with a scalar base value if every lane "knew" its location within Va. However, for some vector processing circuits it may be more straightforward to include a vector of base values, so that each lane does not need to be aware of its position within the vector, but in an alternative implementation we could imagine a single base value being sufficient.

The binary value represented by Vi is a two's complement number, so we change the 24-bit significand to a two's complement number (we could also change to two's complement after the conversion, but converting a 279-bit value is much slower than converting a 24-bit value). We convert to two's complement in the usual way: doing nothing if the number is positive, otherwise using the value ~significand+1. After this conversion, the conversion to 279-bits proceeds exactly as in the preceding paragraph, but using the possibly altered significand and setting bits to the left of the significand to sign bits instead of zeros.

The beauty in this method lies in its flexibility. There are many possible fixed-point numbers that a programmer might want to use to represent the FP number. Suppose the programmer was certain that all of the FP significand bits would end up in the range 70-197? Then by appropriately altering the entries in Va the fixed-point number could be held in a 128-bit destination. Dealing with 128-bit fixed-point numbers is a lot faster than dealing with possibly much larger fixed-point numbers.

It would also be desirable to add the products of FP numbers precisely, and our method easily extends to permit this. The proposed instruction would be MUL_SP_to_HPA Vi, Va, Sn, Sm Vi will contain the fixed-point result, and again Va will contain boundary information for each lane. The two SP numbers Sn and Sm are multiplied without rounding, retaining the full 48-bit product of the significands, and computing a new exponent that is a 9-bit biased (excess 255) representation of the product exponent. The extra exponent bit is provided because the product of two SP numbers can be much larger or much smaller than an SP number. The conversion happens exactly the same as in the CVT_SP_to_fixed instruction, taking the two's complement of the product, then having each lane compute based on Va whether the fixed-point number has any significant bits, and filling in the remaining bits with sign bits to the left of the significand and zeros to the right.

Besides the two SP instructions proposed, there will be two analogous DP instructions, or instructions for any other floating-point format. They work in the same way, but know how to interpret the DP input or product (wider significands and exponents). The sizes of fixed-point vectors can be much higher for DP. We might want to exclude huge (bigger than representable) or tiny (smaller than representable) numbers. The maximum size for the main interesting cases is as follows:

| input | first bit | frac bits | length | 64-bit words |
|---|---|---|---|---|
| DP | 2046 | 52 | 2099 | 33 |
| DP prod | 4092 | 105 | 4,198 | 66 |
| DP prod nontiny | 3069 | 105 | 3175 | 50 |

-continued

| input | first bit | frac bits | length | 64-bit words |
|---|---|---|---|---|
| DP prod, nontiny + nonhuge | 2046 | 105 | 2152 | 34 |
| SP | 254 | 23 | 278 | 5 |
| SP prod | 508 | 47 | 556 | 9 |
| SP prod nontiny | 381 | 47 | 429 | 7 |
| SP prod, nontiny + nonhuge | 254 | 47 | 302 | 5 |

The "first bit" column says how many possible places can hold the first bit of the significand, and "frac bits" says how many fraction bits follow that significand (these numbers are higher for products). The "length" field is just the sum first_bit+frac_bits+1, which is the minimum length required to hold all numbers in fixed-point form for the specified input. The "64-bit words" column is the minimum number of 64-bit words required to hold all numbers in fixed-point form for the specified input.

The row entries are DP (all DP numbers), DP prod (all possible DP products), DP prod nontiny (all products ignoring any bits below DP min subnormal), and DP prod nontiny+nonhuge (all products ignoring any bits below DP subnormal or above DP max). The SP rows have similar explanations. We don't need separate instructions for all of these interesting cases because we can just adjust the boundary vector Va to reflect the bits that we are interested in.

We believe that programmers will create their own boundaries. Perhaps products that are smaller than $2^{-50}$ are irrelevant to a particular computation. These kinds of cases are easily managed by simply adjusting the boundary vector Va.

Figure 21:
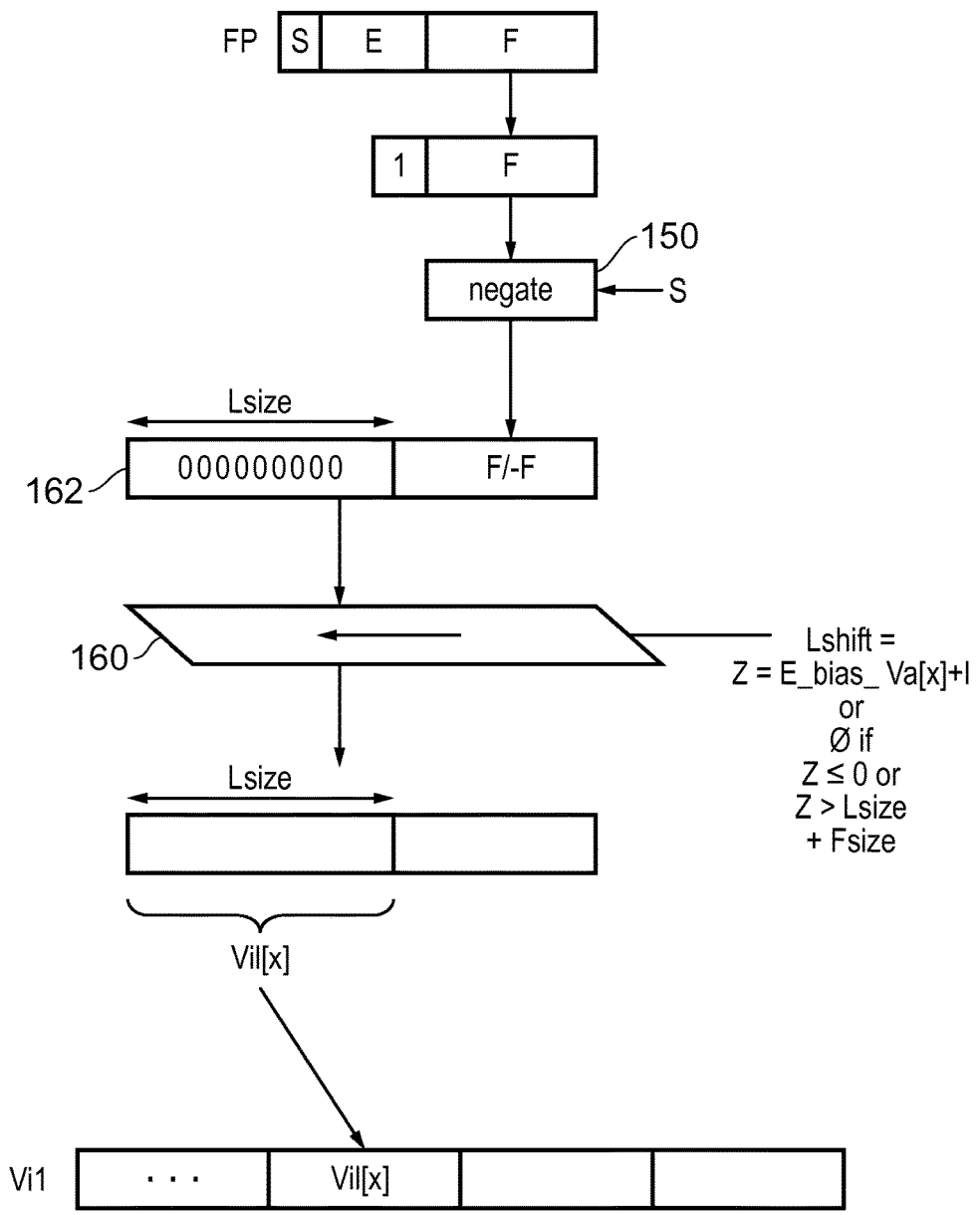
FIG. 21 illustrates an example of converting a floating-point value into a value having the HPA data format.

FIG. 21 shows in more detail an example of converting a floating-point value into a value having the HPA data format. It will be appreciated that the conversion could be implemented with a different series of operations to the ones shown in FIG. 21, which provide the same result. FIG. 21 shows steps performed to generate a single data element Vi1[$x$] of the data vector of the HPA value based on the corresponding anchor vector Va[x], but the same steps can be performed for each other data element in the vector. As shown in FIG. 21, at step 150 the significand F of the floating-point value (including the implicit bit of 1) is negated at step 150 if the sign bit S of the floating-point value is 1. The negation may be performed by inverting the bits of the significand and adding 1, to find the two's complement of the significand value F. Alternatively, if an addition is to be performed on the converted HPA value (e.g. as in FIG. 20 above), then at step 150 the significand F may be inverted to generate the one's complement of the significand, without adding 1 at this stage, and later when performing the addition a carry input to the adder can be asserted to complete the two's complement (this approach may be faster by eliminating one addition step). Either way, the negation accounts for the fact that in the floating-point format, values are represented in sign-magnitude format so that all bits of the significand are negatively weighted if the sign bit is 1, while in the HPA format the vector represents a two's complement value in which even if the most significant bit is 1, any less significant bits are still positively-weighted.

An intermediate value 162 is then formed from the significand F or the modified significand −F resulting from the negation step 150. The significand F or modified significand −F is placed at the least significant portion of the intermediate value 162, with the upper part of the intermediate value 162 comprising a certain number, Lsize, of 0s, where Lsize is the vector lane size (the number of bits within one data element). For example, Lsize may be 64, 128 or 256 bits. A shifter 160 then lefts shifts the intermediate value 162 by a number of places indicated by a shift amount Lshift determined as follows:

Lshift=Z=E−B−Va[x]+1, if Z>0 and Z<Lsize+Fsize, where:
E is the biased exponent of the FP value,
B is the bias amount for the FP value (e.g. 1023 for DP and 127 for SP)
Vm[x] is the target significance of the least significant bit of the data element being processed, as determined from the anchor point value Va,
Lsize is the number of bits in the data element (the vector lane size), and
Fsize is the number of bits in the significand of the FP value (not including the implicit bit).
Lshift=0, if Z≤0 or Z>Lsize+Fsize.

Effectively, Lshift is 0 if none of the bits of the significand F of the FP value have significances corresponding to the significances of the bits of the data element currently being processed. If Lshift is non-zero then left shifting the intermediate value 162 by Lshift bit positions causes at least part of the FP significand to be mapped to bits of corresponding significance within the data element of the HPA vector. The Lsize-bit value for data element Vi[x] is then selected as the upper Lsize bits from the result of the shift.

The same operations can be performed in a similar way for each other data element of the vector to generate the overall vector Vi1 of the HPA value, with each data element representing a respective portion of a binary value corresponding to the floating-point value.

For the processing applied to the most significant data element of the vector, if the shift applied by the shifter 160 results in any non-sign extension bits of the significand F being shifted out past the most significant bit of the shift result, then an exception indication can be generated to signal an overflow condition, which indicates that the floating-point value was larger can be represented by the HPA vector using the metadata indicated. Similarly, for the processing applied to the least significant element of the vector, an underflow exception can be signalled if all the bits of the floating-point value FP have significances smaller than the significance of the least significant bit of that element. Also, an inexact exception can be signalled if some of the bits of the floating-point significand are represented in the converted HPA vector but other bits were less significant than the least significant bit of the vector. These exception conditions can signal that the significance boundaries set in the metadata Vm were inappropriate for the current floating-point value being processed.

The conversion operation shown in FIG. 21 may be performed in response to a dedicated conversion instruction for converting a floating-point value into a corresponding HPA value. Alternatively, the conversion may be performed in response to an arithmetic instruction which also performs some arithmetic. For example, an addition or subtraction instruction may cause a floating-point value to be converted to HPA form before being added or subtracted with another HPA value, or a multiply-and-convert instruction may trigger multiplication of two floating-point operands and the product of these operands in floating-point form may then be converted to an HPA value using the operations shown in FIG. C7.

Similarly, an HPA number can be converted into a floating-point number. The basic instruction for SP is:
CVT HPA to SP Sd, Vd, Va where Sd is the destination SP number, Vd is the data vector containing high-precision fixed-point data, and Va is the anchor vector containing boundary information for each 64-bit lane of Vd. Vd is a two's complement number, and every bit of Vd has a weight based on the boundary information in Va, so if the low-order 64-bit word of Va contains 100, then the low-order bit of the low-order word in Vd has weight 100, and the next bit has weight 101, etc. In the usual case, Va is completely determined by the base value in its low order 64-bits, with each successive 64 bits differing by 64. So in this case
Va=< . . . , 296, 228,164, 100>

The reason we provide a vector Va to have all these values is that each 64-bit lane will interpret its portion of the vector Vd without any global knowledge. If the lanes "knew" their own location within the larger vector then a base value (in this case 100) would give sufficient information to complete the conversion.

The base value corresponds exactly with an exponent in a floating-point number. If we constructed a significand starting at bit 62 of the low-order word of Vd, and Va was as above, then the exponent corresponding to that significand is completely determined by the significand position (62) and the base value (100). For SP numbers that exponent would be 100+62−23=139. The −23 comes from the number of fraction bits in an SP value. In the case where we want to represent all SP numbers, the high-precision fixed-point number would be 278 bits long, and the low order bit of that would correspond to the low order bit of a subnormal number. The first possible normal significand has exponent 1 and would be located at bits [23:0] of Vd.

There are two basic ways of converting Vd to SP, left-to-right or right-to-left.

Left-to-right conversion is more straightforward. The first bit at the top of Vd is a sign bit, and that becomes the sign of the SP result Sd. We then search for the first nonsign bit (zero if the sign is one, one if the sign is zero). That bit becomes the first bit of the significand, and we then take the next 23 bits as the fraction, the $24^{th}$ bit as the guard bit, and the logical OR of all remaining bits as the sticky bit. The exponent is computed based on the weight of the lane in which the first nonsign bit is found (W), the location of the first nonsign bit (L), and the number of fraction bits in an SP number (23), giving an exponent of W+L−23. If the exponent computation returns a value less than zero then the returned exponent is zero. If the input is negative and the first zero is part of a string of 24 or more zeros, then the exponent is incremented by 1. The fraction is unchanged for positive inputs, otherwise the two's complement of the fraction is used. The resulting number is rounded in the usual way, based on rounding mode, the least significant bit of the fraction, the guard, and finally the sticky bit. For double precision the operations are the same but with larger significands and exponents.

Figure 22:
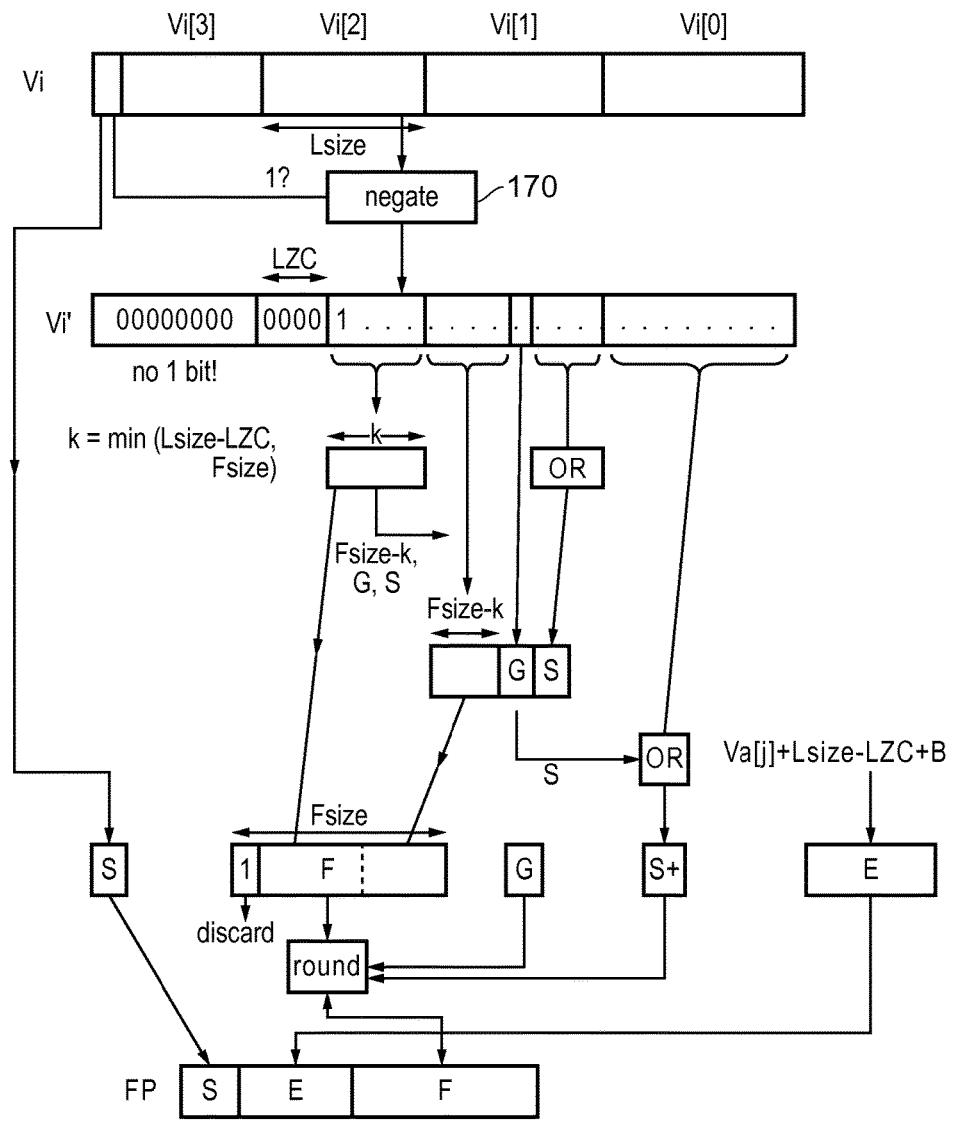
FIG. 22 illustrates an example of converting a value having the HPA data format into a floating-point value.

FIG. 22 shows an example of using left-to-right conversion to convert an HPA value with data vector Vi and metadata Vm into a floating-point value FP. Again, this may be performed in response to a standalone conversion instruction or an arithmetic instruction which includes a conversion as well as some arithmetic. The most significant bit of the data vector Vi is mapped directly to the sign bit S of the floating-point value FP.

To generate the significand F of the floating-point value, a series of operations are performed as follows. If the most significant bit of the vector is 1 (i.e. the HPA value is negative), then at step 170 the vector Vi is negated (invert and add 1) to produce a modified vector Vi'. For positive values the vector Vi is unchanged. Hence, the vector Vi' has at least one leading zero, so represents a positive value. Starting with the most significant element of the vector, a significand generation operation is performed element by element sequentially. The processing lane for the most significant element searches for the first non-sign bit within that element (i.e. the first bit value of 1). In this example the upper element Vi[3] does not comprise any non-sign bits and so processing moves to the next lane Vi[2].

The processing for element Vi[2] identifies a non-sign bit of 1 and determines a leading zero count LZC representing the number of zeroes preceding the non-sign bit 1. A partial significand is then formed from k bits of the corresponding data element Vi[2], where k=min(Lsize−LZC, Fsize), where Lsize is the number of bits in one data element, Fsize is the number of bits in the significand of the FP value to be generated (including the implicit bit) and LZC is the leading zero count. The k-bit partial significand value is output together with an indication (Fsize−k) of the number of remaining bits still to be obtained for the significand, a guard bit G and sticky bit S. If Lsize−LZC>Fsize, then the guard bit G equals the bit of element Vi[2] one place to the right of the bits taken for the partial significand, and if Lsize−LZC<=Fsize then G=0. Similarly, if Lsize−LZC>Fsize+1 then the sticky bit S equals a bitwise OR of any bits of element Vi[2] to the right of the guard bit G, and otherwise the sticky bit S=0.

The processing then moves to the next lane for element Vi[1], where another partial significand value is generated. The upper portion of element Vi[1] is selected as the partial significand, with the number of bits taken corresponding to the value Fsize−k which was output from the previous lane. This lane also updates the values of the guard and sticky bits G, S, with the guard bit G being equal to the bit of element Vi[1] one place to the right of the lowest bit taken for the partial significand and the sticky bit S corresponding to the bitwise OR of any bits less significant than the guard bit G. The lane of processing for the least significant element Vi[0] receives the sticky bit S from the higher lane and updates it by ORing all bits of element Vi[0] with the sticky bit S from the previous lane.

The partial significands generated for lanes 2 and 1 are then concatenated to form a significand value F. The significand is rounded based on the values of the guard and sticky bits G, S, using any desired rounding mode. The stored significand for the floating-point value FP is then obtained from the rounded significand value, ignoring the most significant bit of the rounded significand, which is implicit in the floating-point representation.

Meanwhile, the biased exponent E for the floating-point value is determined as:

E=Va[j]+Lsize−LZC+B, where Va[j] is the significance of the least significant bit of the data element Vi[j] within which the most significant non-sign bit was found (e.g. the significance indicated by the anchor point value for element Vi[2] in the example shown in FIG. 22), Lsize is the number of bits in one data element, LZC is the leading zero count and B is the bias value for the floating-point representation being used.

If Fsize<Lsize, then at most only two adjacent data elements can contain bit values which contribute to the unrounded significand F, as in the example of FIG. 22, and other lanes will either be more significant lanes containing only sign bits or less significant lanes which contribute only to the sticky bit S. It is also possible that the unrounded significand could be formed entirely from bit values within one lane, depending on the position of the first non-sign bit within a lane. However, if Lsize<Fsize then there may be more lanes which contribute to the unrounded significand.

FIG. 22 shows an example of processing each data element of the HPA value sequentially from left to right. However, as the vector size becomes larger this may be relatively slow. This may not always be a problem. For example, with the accumulation operation shown in FIG. 20 the conversions from FP to HPA may occur much more frequently than a conversion back from HPA to FP (the FP-HPA conversion occurs for each addition, while the HPA-FP conversion occurs only once the final result is generated). However, if it is desired to speed up processing, it is possible to perform operations in parallel for several lanes. For example, processing circuitry of the form shown in FIG. 19 may be used. In this case, each lane may detect the highest non-sign bit and generate a partial significand assuming that it contains the highest non-sign bit within the entire vector, and then the processing circuitry may later combine the partial significands by obtaining Fsize bits from the lane which actually contains the first non-sign bit, and if necessary obtain Fsize−k bits from the next lane down.

Right-to-left conversion is also possible, where the least significant element is processed first. Suppose Vd=<D4, D3, D2, D1, D0>, which is sufficient to hold any SP number, and let Va=<256,192, 128, 64, 0>. Recall that the Va vector may specify another range for the Vd source Two methods could be used for right-to-left conversion.

1. The lane holding D0 computes an SP number as if only those 64-bits were available, using the same algorithm as in the left-to-right conversion but without doing any rounding or sign-based manipulation. The value returned is a 35-bit vector <sign, exponent[7:0], significand[23:0], guard, sticky>. The lane holding D1 does the same thing, but also looks at the data generated by the D0 lane. If the D1 lane is all sign bits then the D0 result is passed upward. Otherwise a new SP number is computed based on the new location of the first non-sign bit. Some of the fraction bits for this new number might come from D0, but we have the information about those bits from the 35-bit vector returned by that lane. We also compute new exponent, sign, guard and sticky bits. The process is repeated for D2, and then D3, and finally ends by rounding the vector returned by the D4 lane. DP conversions work just the same way, but have larger exponents and significands.

2. In the second method, each Dx block computes the 35-bit vector independently of the others. In a system with 4 Dx blocks implemented in hardware, each 35-bit vector is output to a second block that computes a single 35-bit vector for the set of 4 Dx blocks. This value is held and combined in a like fashion with the 35-bit vector from the output of the next set of data bits. In the example above, with a 256-bit Shoji engine, 64-bit chunks D3 to D0 would be processed in the first iteration, each Dx block producing a 35-bit vector, and a final vector generated for the D3 to D0 set. A second pass would generate another 35-bit vector for the bits in the D4 block, and the second block would combine this vector with the vector from the lower D3-D0 blocks to generate a final vector. This final vector would be rounded according to the specified or default rounding mode to produce the final single-precision result. As with method 1, DP conversions would work similarly, but require different implementation due to the large exponents and significands.

We do not require all of the 278 possible bits to generate an SP number if the boundary vector contains values that limit our possible range, and similarly we don't need all 2099 possible bits to generate a DP number if the boundary vector limits the range. Also notice that some numbers may be beyond the range of SP or DP numbers. This is especially likely when converting sums of products, but it can also happen when adding many large numbers. Numbers that are bigger than DP or SP max should follow the usual rounding conventions (usually returning infinity), and numbers that are smaller than DP or SP min subnormal should adjust the sticky bit before rounding. To support this a means of capturing an overflow will be required, and in one embodiment a single bit identifying the overflow condition would be sufficient.

Nothing prevents a high-precision fixed-point sum from being converted to a different format than its inputs. For example, half-precision and quad-precision (128-bit formats) may be implemented using the same methods as described above, as could any imaginable integer or fixed-point format or decimal floating-point format.

An apparatus may have processing circuitry for performing arithmetic operations. The processing circuitry may be responsive to programmable significance data indicative of a target significance for the result value to generate a result value having the target significance. This exploits the realisation that in practice the programmer is aware of what range of significance is expected to accommodate typical data values for a given application, e.g. data measured by a temperature sensor on Earth is likely to be limited to a relatively confined range of values depending on the location of the sensor or the precision of the sensor. Hence, the programmer can set programmable significance data to specify an expected significance for the result. The processing circuitry then does not have to calculate portions of the result outside those boundaries, to save energy and provide faster processing.

For example the programmable significance data may cause the processing circuitry to generate the result value having the target significance independent of the significance of at least one operand used to generate the result value. Hence even if the operands have values such that the result of a given arithmetic operation should be outside the significance indicated in the programmable significance data, the result may still be generated with the indicated significance even if that may be incorrect. In some cases the result value may be an integer or fixed-point data value, or a value represented in the HPA format discussed above. In some examples the programmable significance data may comprise boundary information indicative of at least one significance boundary for the result value. The processing circuitry may respond to the boundary information to determine bit values of the result value having significance within the at least one significance boundary. The processing circuitry may for example for example limit processing to determining the portions of the result value within the indicated boundaries.

In some examples the boundary information may indicate at least one of a lower significance boundary and upper significance boundary indicative of a significance of least and most significant bits of the result value respectively. In some cases both the lower and upper boundaries may be indicated explicitly by the boundary information. Alternatively one of these may be indicated and the other could be implicit from the size (length) of the value being processed. The size could be fixed, or could be a variable size specified in the boundary information. In some examples the target size indicated by the programmable data may be independent of the size of values supported in hardware. For example the hardware may only be able to generate a maximum of N bits of the result value in parallel. If the programmable size information indicates a size of more than N bits then the arithmetic operation may be performed in multiple passes of the hardware. If the size is less than N bits then not all of the hardware may be used.

For example, processing units for performing parallel lanes of processing may be provided in the processing circuitry and the programmable significance data may specify how many lanes should be used. The programmable significance data may indicate a significance for one of the lanes, with the significance for other lanes being determined from this indication. Alternatively, the significance may be expressed separately for each lane, which can be useful to allow each lane to process the data elements for that lane, without needing any "global knowledge" of that lane's position within the overall vector.

In another example an apparatus may have at least one data storage element, and a metadata storage element for storing metadata for at least one corresponding data storage element. The metadata (e.g. the anchor point value discussed above) may be indicative of a target significance and target length of a data value to be stored in the corresponding data storage element. Hence, the metadata may be associated with the storage element rather than any particular data value stored in the data storage element. When generating a data value to be placed in the data storage element, processing circuitry may reference the corresponding metadata in the metadata storage element to determine the significance and size of the data value to be generated. This allows the processing circuitry to limit its processing to generate bit values within the window defined by the target significance and size specified by the metadata.

Again, the metadata may be programmable. In some cases the metadata storage element may be a separate storage element from the data storage element. In other examples the metadata storage element may comprise part of the corresponding data storage element.

In some cases one metadata storage element may be shared between a number of data storage elements so that they each share the same metadata. A data storage element may include a programmable value which indicates which metadata storage element should be associated with it.

The target size indicated by the metadata may be independent of the physical size of the data storage elements themselves. Hence, the metadata may specify a target size which is greater than the storage element size of the data storage element. If the target size is larger than the data storage element size then the data value may be stored across a number of data storage elements. The metadata may include information specifying how many data storage elements represent portions of the same data value.

The metadata may also express other information such as exception information indicating whether an exception condition has arisen during generation of the data value in the corresponding data storage element, sign information indicating whether the data value is positive or negative, or characteristic information indicating a characteristic of the data value such as whether it is zero, infinity or Not a Number. For example, the exception information may indicate an overflow condition if the result of an arithmetic operation for generating the data value to be stored in the data storage element was larger than could be represented using a value having the target significance and length indicated in the metadata.

In other examples, an apparatus may be provided with processing circuitry to perform a conversion operation to convert a floating-point value to a vector comprising a plurality of data elements representing respective bit significance portions of a binary value corresponding to the floating-point value. This is useful for supporting arithmetic using the vector format which is more easily parallelized than floating-point arithmetic using the floating-point value itself. Representing the binary value in a vector form is useful because this provides a framework for allowing processing hardware to scale the amount of processing it carries out depending on the number of data elements of the vector. For example, the vector may have the HPA format discussed above. The vector may have a greater number of bits than a significand of the floating-point value, to provide increased precision.

The conversion operation may be responsive to programmable control information so that processing circuitry selects values for each data element of the vector based on the floating-point value and the control information. The control information could be specified as a parameter in an instruction executed to perform the conversion operation, for example as an immediate value or a register specifier identifying a register storing the control information, or could be provided in a dedicated location such as a control register.

In one example the control information may indicate a significance of at least one of the bit significance portions to be represented by the data element of the vector to be generated in the conversion operation. Hence, the vector may represent binary values of programmably selected significance. In some cases the control information may indicate a significance for a predetermined data element of the vector, with significances of other elements derived from the significance of the predetermined data element (e.g. counting up in intervals of a known data element size). However, other examples may provide separate indications of the significance for each element. This is useful to simplify vector processing so that each vector lane does not need to consider the position of its data element relative to other elements.

The control information may also indicate a variable number of data elements of a vector. This can be done with an explicit size indication specifying the number of data elements, or by using the significance indications for each lane. For example, a predetermined bit pattern indicated for the significance of a particular data element may signal that this data element is not being used in the current calculation.

The control information may be independent of the floating-point value being converted. Therefore, irrespective of the significance or value of the floating-point value, a vector may be generated with the significance and/or size indicated in the control information even if the floating-point value would have a value which could not be represented exactly by a vector of this significance and size.

Some implementations may use processing circuitry which generates a single element of the vector at a time. However, to improve performance the processing circuitry may have processing units to generate at least two of the data elements to the vector in parallel.

The conversion may be performed in different ways. In one example, for each data element the processing circuitry may determine based on the exponent of the floating-point value and the significance of the portion of the binary value to be represented by that data element, whether to populate the data element with bit values selected based on the floating-point value. For example, some data elements may have a significance which does not correspond to the significance of any of the bits of the floating-point significand, in which case these elements would not be populated with any bit values selected from the floating-point significand. In one example, for each data element the processing circuitry may form an initial value depending on the significand of the floating-point value and then shift the initial value by a shift amount which depends on the exponent of the floating-point value and the significance indicated by the control information for that data element. This provides a relatively simple technique in which each lane of processing can generate its data element independently of any other lanes, which is useful for supporting either a sequential or parallel implementation of the vector processing. The result vector can then be assembled from the values generated by the shifter for each lane. The shift operation may also be useful for generating exception information to indicate overflow, underflow or imprecision conditions when the binary value corresponding to the floating point value cannot be exactly represented by the vector having the significance or size indicated in the metadata. Such exception information may allow the system to determine when the significance set by the programmer is not suitable for handling the current values of floating-point value being converted.

In general each data element may comprise a two's complement value (as opposed to the significand of the floating-point value in sign-magnitude form). Therefore, if the floating-point value is negative, a negation operation may be performed during the conversion operation so that at least one data element of the vector is generated with a value which has been negated relative to a significand of the floating-point value. This ensures that the vector represents a value of the same sign as the floating-point value.

In general the processing circuitry may perform the conversion operation in response to a first instruction, which could be a standalone conversion instruction for performing a conversion only, or an arithmetic instruction which combines an arithmetic operation with the conversion. For example, in response to the arithmetic instruction the processing circuitry may perform an arithmetic operation (e.g. a multiplication) to generate a result floating-point value, which can then be converted into the vector during the conversion operation. In other examples, the conversion may be performed first and then an arithmetic operation (e.g. addition or subtraction) may be applied to the converted vector and a further vector.

Also, a conversion operation may be performed to convert a vector of the form discussed above into a scalar value which represents an alternative representation of the binary value represented by the respective bit significance portions of the vector. For example, the scalar value could be a binary or decimal floating-point value, an integer value or a fixed-point value. This allows the vector form discussed above to be mapped back to an externally representable format as required. For example, for compatibility with other devices it may be useful to map the vector format used for internal processing to a fixed-point, integer or floating-point format.

Again, the vector-to-scalar conversion operation may be responsive to programmable control information to generate the scalar value in dependence on the vector. The control information could be specified in the instruction via an immediate value or register specifier, or be placed in a fixed control register. The control information may indicate significance of the bit significance portions represented by the data elements of the vector, either as a single value or as multiple values specified separately for each element. The control information may also specify how may data element of the vector are present. This allows the programmer to define control information so that vector can represent binary values of variable size and significance. The vector can be processed sequentially element-by-element, or in parallel with processing units to process at least of the two data elements in parallel.

If the scalar is an integer or fixed-point value, then for at least some of the data elements of the vector the processing circuitry may select, based on the significance indicated by the control information, one or more bits of the data elements which have a corresponding significance to bit positions of the scalar value, and then form the scalar value based on the selected bits.

For converting the vector to a floating-point value, the processing circuitry may determine an exponent based on a position of a most significant non-sign bit of the vector and the significance indicated by the control information for the data element of the vector having the most significant non signed bit. The significand of the floating-point value may be generated by performing a significand generation operation to generate a partial significand value for at least one of the elements for the vector, with the significand of the floating-point value formed based on the partial significand values generated for each element. For example, the significand generation operation for a given data element may comprise detecting whether that element has at least one non-sign bit, and if so, outputting as the partial significand value the most significant non-sign bit of the data element and a number of less significant bits of the data element selected depending on the position of the most significant non signed bit.

In some implementations the significand generation operation may be performed in parallel for at least some of the data elements to speed up processing. The results for each element may then be combined later to determine the overall significand. For example, each processing lane may perform the significand generation operation on the assumption that its element of the vector contains the most significant non-sign bit of the entire vector. The processing circuitry may then form the significand of the floating-point value based on which lane actually contains the most significant non-sign bits, once the results of each lane are known.

Alternatively, the significand generation operation may be performed sequentially for at least some of the elements. This may simplify processing because for at least some lanes it may not be necessary to generate a partial significand if it is already known that the significand will be formed entirely from partial significand values generated for other lanes. The significand generation operation for a later element may depend on information generated in the significand generation operation for an earlier element, to reduce the amount of processing required. In one example the significand generation operations may be performed sequentially from left to right starting with the most significant element of the vector and ending with the least significant element. In this case, when the most significant element having a non-sign bit is located then if the partial significant value generated for that element has fewer bits than the total number of bits required for the significand of the floating-point value, a control value indicating a number of remaining bits to be generated can be output and this can be used in the significand generation operation for the next element to select the required remaining number of bits. This avoids the need to perform the full significand generation operation for each element. Lanes of processing for less significant elements of the vector may merely update status information such as guard/sticky bits used for rounding, rather than needing to generate a partial significand.

In other examples, the significand generation operation can be applied sequentially from right to left starting with the least significant portion and ending with a more significant portion of a vector.

When the scalar value comprises a floating-point value and the vector represents a negative binary value, a negation operation may be performed during the conversion operation so that the significand of the floating-point value has a binary value which has been negated relative to at least part of the vector. This preserves the sign of the number represented in the vector format.

As for floating-point to vector conversions, the vector-to-scalar conversion may be performed in response to a dedicated conversion instruction or an arithmetic instruction which combines the conversion with an arithmetic operation.

In general, conversions may be performed in either direction between a value having the high position anchored point (HPA) format discussed in this specification and another data value providing an alternative representation of binary value represented by the HPA data value.

Other examples may provide:
(1) An apparatus comprising:
processing means for performing a conversion operation to convert a vector comprising a plurality of data elements representing respective bit significance portions of a binary value to a scalar value comprising an alternative representation of said binary value.
(2) An apparatus comprising:
processing means for performing a conversion operation to convert a first data value in a high-precision anchored format to a second data value providing an alternative representation of the first data value.
(3) A data processing method comprising:
performing, using processing circuitry, a conversion operation to convert a first data value in a high-precision anchored format to a second data value providing an alternative representation of the first data value.

Although illustrative embodiments have been described in detail herein with reference to the accompanying drawings, it is to be understood that the invention is not limited to those precise embodiments, and that various changes and modifications can be effected therein by one skilled in the art without departing from the scope and spirit of the appended claims.

We claim:

1. An apparatus comprising:
processing circuitry to perform a conversion operation to convert a vector comprising a plurality of data elements representing respective bit significance portions of a binary value to a floating-point value comprising an alternative representation of said binary value; the processing circuitry comprising:
exponent determining circuitry to determine an exponent of the floating-point value based on a position of a most significant non-sign bit within the plurality of data elements and a significance of the data element comprising the most significant non-sign bit; and
significand determining circuitry to perform a significand generation operation to generate a partial significand value for at least one of the plurality of data elements, and to form a significand of the floating-point value based on the partial significand value generated for said at least one data element.

2. The apparatus according to claim 1, wherein the significand generation operation for a selected data element comprises detecting whether the selected data element comprises at least one non-sign bit, and when the selected data element comprises at least one non-sign bit, outputting as the partial significand value for the selected data element a most significant non-sign bit and a number of less significant bits of the data element selected depending on the position of the most significant non-sign bit within the selected data element.

3. The apparatus according to claim 1, wherein the processing circuitry is configured to perform the significand generation operation in parallel for at least some of the plurality of data elements.

4. The apparatus according to claim 1, wherein the processing circuitry is configured to perform the significand generation operation sequentially for at least some of the plurality of data elements.

5. The apparatus according to claim 4, wherein the significand generation operation for a later processed data element is dependent on information generated in the significand generation operation for an earlier processed data element.

6. The apparatus according to claim 4, wherein the processing circuitry is configured to perform the significand generation operation for a first data element before performing the significand generation operation for a second data element representing a less significant bit significance portion of the first value than the first data element.

7. The apparatus according to claim 6, wherein in the significand generation operation for the first data element, when the partial significand value generated for the first data element comprises fewer bits than a number of bits required for a significand of the floating-point value, the processing circuitry is configured to output a control value indicating a number of remaining bits of the significand of the floating-point value to be generated, and in the significand generation operation for the second data element, the processing circuitry is configured to generate the partial significand value comprising a number of bits of the second data element selected based on the control value output for the first data element.

8. The apparatus according to claim 4, wherein the processing circuitry is configured to perform the significand generation operation for a first data element before performing the significand generation operation for a second data element representing a more significant portion of the first value than the first data element.

9. The apparatus according to claim 1, wherein in the conversion operation, the processing circuitry is to generate the floating-point value in dependence on the vector and programmable control information.

10. The apparatus according to claim 9, wherein the control information is indicative of a significance of the bit significance portions represented by the data elements.

11. The apparatus according to claim 10, wherein the control information is indicative of a significance of the bit significance portion represented by a predetermined data element of said plurality of data elements, and the processing circuitry is to determine the significance of the bit significance portion to be represented by at least one other data element in dependence on the significance indicated for the predetermined data element.

12. The apparatus according to claim 10, wherein the control information comprises separate indications of the significance of the bit significance portions represented by the plurality of data elements.

13. The apparatus according to claim 9, wherein the control information is indicative of a variable number of data elements of the vector.

14. The apparatus according to claim 1, wherein the vector comprises a greater number of bits than the floating-point value.

15. The apparatus according to claim 1, wherein the processing circuitry comprises a plurality of processing units to process at least two of the data elements in parallel.

16. The apparatus according to claim 1, wherein the processing circuitry is configured to determine whether the binary value represented by the vector is negative, and when the binary value is negative, to perform a negation operation during the conversion operation to generate the significand of the floating-point value with a value negated relative to at least part of at least one data element of the vector.

17. The apparatus according to claim 1, wherein the processing circuitry is to perform the conversion operation in response to a first instruction.

18. The apparatus according to claim 17, wherein the first instruction comprises a conversion instruction.

19. The apparatus according to claim 17, wherein the first instruction comprises an arithmetic instruction.

20. A data processing method comprising:
performing, using processing circuitry, a conversion operation to convert a vector comprising a plurality of data elements representing respective bit significance portions of a binary value to a floating-point value comprising an alternative representation of said binary value;
determining an exponent of the floating-point value based on a position of a most significant non-sign bit within the plurality of data elements and a significance of the data element comprising the most significant non-sign bit; and
performing a significand generation operation to generate a partial significand value for at least one of the plurality of data elements, and forming a significand of the floating-point value based on the partial significand value generated for said at least one data element.

\* \* \* \* \*